(12) United States Patent
Oh et al.

(10) Patent No.: US 11,917,818 B2
(45) Date of Patent: *Feb. 27, 2024

(54) MEMORY DEVICE HAVING VERTICAL STRUCTURE INCLUDING A FIRST WAFER AND A SECOND WAFER STACKED ON THE FIRST WAFER

(71) Applicant: SK hynix Inc., Icheon-si (KR)

(72) Inventors: Sung Lae Oh, Icheon-si (KR); Sang Woo Park, Icheon-si (KR); Dong Hyuk Chae, Icheon-si (KR); Ki Soo Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/058,795

(22) Filed: Nov. 25, 2022

(65) Prior Publication Data

US 2023/0100075 A1 Mar. 30, 2023

Related U.S. Application Data

(63) Continuation of application No. 17/062,834, filed on Oct. 5, 2020, now Pat. No. 11,538,820.

(30) Foreign Application Priority Data

May 29, 2020 (KR) .................... 10-2020-0065284

(51) Int. Cl.
*H10B 41/27* (2023.01)
*H01L 29/417* (2006.01)
(Continued)

(52) U.S. Cl.
CPC ............ *H10B 41/27* (2023.02); *G11C 16/08* (2013.01); *G11C 16/24* (2013.01); *H01L 24/05* (2013.01); *H01L 24/20* (2013.01); *H01L 24/29* (2013.01); *H01L 25/18* (2013.01); *H01L 27/0296* (2013.01); *H01L 29/0649* (2013.01); *H01L 29/41741* (2013.01); *H10B 41/10* (2023.02); *H10B 41/35* (2023.02); *H10B 41/41* (2023.02); *H10B 43/10* (2023.02); *H10B 43/27* (2023.02); *H10B 43/35* (2023.02); *H10B 43/40* (2023.02);
(Continued)

(58) Field of Classification Search
CPC ........ H10B 41/10; H10B 41/27; H10B 41/35; H10B 41/41; H10B 43/10; H10B 43/27; H10B 43/35; H10B 43/40; H10B 43/50; G11C 16/08; G11C 16/24
USPC ........................................................ 257/314
See application file for complete search history.

(56) References Cited

U.S. PATENT DOCUMENTS 10,748,886 B2 * 8/2020 Park ...................... H10B 43/30
10,930,661 B2 2/2021 Chen et al.
(Continued)

FOREIGN PATENT DOCUMENTS

CN 107658317 A 2/2018
CN 110168725 A 8/2019
(Continued)

*Primary Examiner* — Khiem D Nguyen

(57) ABSTRACT

A memory may include a first wafer, and a second wafer stacked on and bonded to the first wafer. The first wafer may include a cell structure including a memory cell array; and a first logic structure disposed under the cell structure, and including a row control circuit. The second wafer may include a second logic structure including a column control circuit.

14 Claims, 23 Drawing Sheets

(51) Int. Cl.
  *H01L 23/00* (2006.01)
  *G11C 16/24* (2006.01)
  *H10B 41/10* (2023.01)
  *G11C 16/08* (2006.01)
  *H01L 25/18* (2023.01)
  *H01L 27/02* (2006.01)
  *H01L 29/06* (2006.01)
  *H10B 41/35* (2023.01)
  *H10B 41/41* (2023.01)
  *H10B 43/10* (2023.01)
  *H10B 43/27* (2023.01)
  *H10B 43/35* (2023.01)
  *H10B 43/40* (2023.01)

(52) U.S. Cl.
  CPC ............... *H01L 2924/1431* (2013.01); *H01L 2924/1438* (2013.01)

(56) References Cited

U.S. PATENT DOCUMENTS

| | | | |
|---|---|---|---|
| 11,538,820 B2* | 12/2022 | Oh | H01L 27/0251 |
| 2012/0014164 A1* | 1/2012 | Kamoshida | G11C 13/0004 |
| | | | 365/148 |
| 2019/0043836 A1* | 2/2019 | Fastow | H10B 41/27 |
| 2019/0115361 A1 | 4/2019 | Kim et al. | |
| 2019/0326166 A1 | 10/2019 | Nam et al. | |
| 2019/0363129 A1 | 11/2019 | Yokoyama et al. | |
| 2020/0020712 A1* | 1/2020 | Kim | H10B 43/10 |
| 2020/0058669 A1 | 2/2020 | Chen et al. | |
| 2020/0328180 A1* | 10/2020 | Cheng | H01L 21/78 |
| 2020/0365617 A1 | 11/2020 | Ahn et al. | |
| 2020/0388630 A1* | 12/2020 | Yun | H01L 23/53266 |
| 2021/0065751 A1 | 3/2021 | Park et al. | |
| 2021/0233927 A1 | 7/2021 | Oh | |

FOREIGN PATENT DOCUMENTS

| | | |
|---|---|---|
| KR | 10-2021-0100235 A1 | 8/2021 |
| KR | 10-2021-0110995 A1 | 9/2021 |

\* cited by examiner

FIG.3
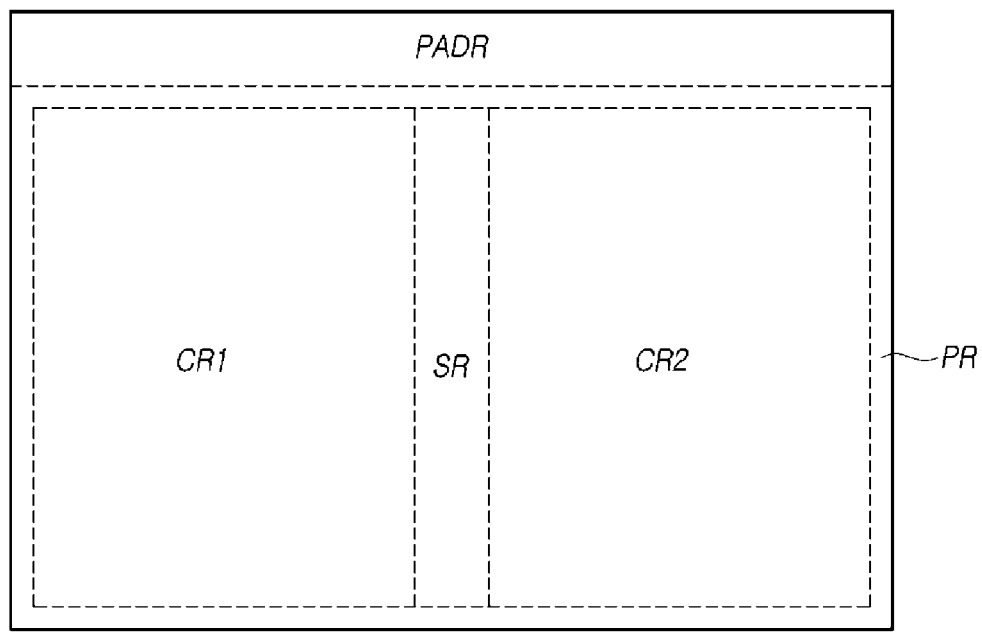
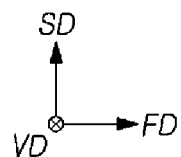

US 11,917,818 B2

MEMORY DEVICE HAVING VERTICAL STRUCTURE INCLUDING A FIRST WAFER AND A SECOND WAFER STACKED ON THE FIRST WAFER

CROSS-REFERENCE TO RELATED APPLICATION

The present application is a continuation application of a U.S. patent application Ser. No. 17/062,834, filed on Oct. 5, 2020, issue as U.S. Pat. No. 11,538,820, which claims priority under 35 U.S.C. § 119(a) to Korean Patent Application No. 10-2020-0065284 filed in the Korean Intellectual Property Office on May 29, 2020, which is incorporated herein by reference in its entirety.

BACKGROUND

1. Technical Field

Various embodiments generally relate to a semiconductor technology, and more particularly, to a memory device having a vertical structure.

2. Related Art

A memory device may include a memory cell array composed of memory cells that have different states depending on data stored therein. The memory cells may be accessed by word lines and bit lines, and the memory device may include circuits that are configured to access the memory cells by controlling the word lines and the bit lines. In addition, the memory device may include circuits that are configured to perform an operation requested from the outside, such as data write, read and erase operations.

SUMMARY

Various embodiments are directed to measures capable of contributing to increasing the layout utilization efficiency of a memory device and reducing the size of the memory device.

In an embodiment, a memory device may include: a first wafer, and a second wafer stacked on and bonded to the first wafer. The first wafer may include: a cell structure including a memory cell array; and a first logic structure disposed under the cell structure, and including a column control circuit. The second wafer may include a second logic structure including a row control circuit.

In an embodiment, a memory device may include: a first wafer, and a second wafer stacked on and bonded to the first wafer. The first wafer may include: a cell structure including a memory cell array; and a first logic structure disposed under the cell structure, and including a row control circuit. The second wafer may include a second logic structure including a column control circuit.

BRIEF DESCRIPTION OF THE DRAWINGS

FIG. 3 is a top view illustrating a representation of an example of regions of a memory device in accordance with an embodiment of the disclosure.

DETAILED DESCRIPTION

Figure 1:
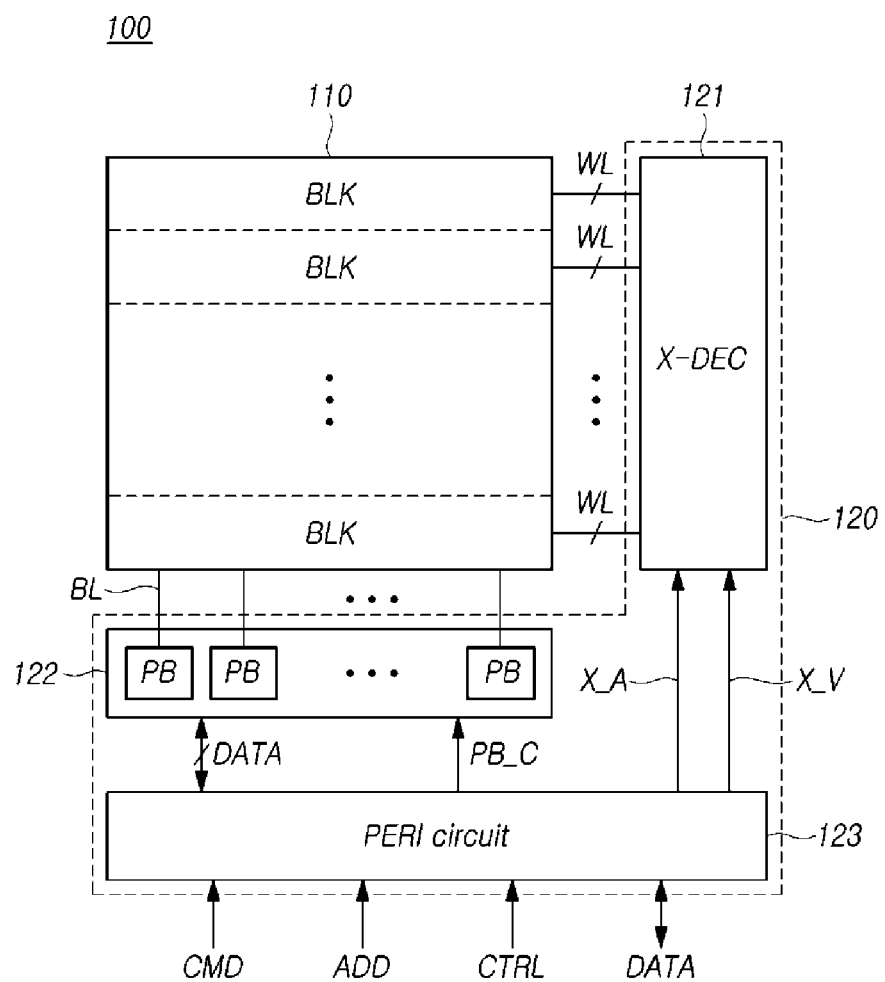
FIG. 1 is a block diagram schematically illustrating a representation of an example of a memory device in accordance with an embodiment of the disclosure.

Advantages and features of the disclosure and methods to achieve them will become apparent from the descriptions of exemplary embodiments herein below with reference to the accompanying drawings. However, the present disclosure is not limited to the exemplary embodiments disclosed herein but may be implemented in various different ways. The exemplary embodiments are provided to thoroughly and fully convey the scope of the present disclosure to those skilled in the art.

Because the figures, dimensions, ratios, angles, numbers of elements used in the drawings to describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist of the disclosure, the detailed description thereof will be omitted. It is to be noticed that the terms "comprising," "having," "including" and so on, used in the description and claims, should not be interpreted as being restricted to the means listed thereafter unless specifically stated otherwise. Where an indefinite or definite article (e.g., "a," "an" or "the") is used when referring to a singular noun, the use of the article may include a plural of that noun unless specifically stated otherwise.

In interpreting elements in embodiments of the disclosure, they should be interpreted as including error margins even without explicit statements.

Also, in describing the components of the disclosure, there may be used terms such as first, second, A, B, (a), and (b). These are solely for the purpose of differentiating one component from another component and the terms do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked," but also indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram schematically illustrating a representation of an example of a memory device in accordance with an embodiment of the disclosure.

Referring to FIG. 1, a memory device 100 in accordance with the embodiment of the disclosure may include a memory cell array 110 and a logic circuit 120. The logic circuit 120 may include a row decoder (X-DEC) 121, a page buffer circuit 122 and a peripheral circuit (PERI circuit) 123.

The memory cell array 110 may include a plurality of memory blocks BLK. The memory block BLK may include a plurality of memory cells. The memory block BLK may be coupled to the row decoder 121 through a plurality of word lines WL. The memory cell array 110 may be coupled to the page buffer circuit 122 through a plurality of bit lines BL. Although, in the present specification, the memory device 100 is a flash memory device in described examples, the type of a memory is not limited thereto, and the technical spirit of the disclosure may be applied to other memories in addition to flash memory. For example, a memory may be a DRAM. Although FIG. 1 illustrates a row control circuit coupled to the word lines WL of the memory cell array 110 as a row decoder, and a column control circuit coupled to the bit lines BL of the memory cell array 110 as a page buffer circuit, this represents a circuit configuration in which a memory is a flash memory, and it should be understood that the row control circuit and the column control circuit may be changed depending on the type of memory used.

The row decoder 121 may select any one among the memory blocks BLK included in the memory cell array 110, in response to a row address X_A provided from the peripheral circuit 123. The row decoder 121 may transfer an operating voltage X_V, provided from the peripheral circuit 123, to word lines WL coupled to a memory block BLK that is selected from among the memory blocks BLK included in the memory cell array 110.

Although not illustrated, the row decoder (X-DEC) 121 may include a pass transistor circuit and a block switch circuit. The pass transistor circuit may include a plurality of pass transistor groups. The plurality of pass transistor groups may be coupled to the plurality of memory blocks BLK, respectively. Each pass transistor group may be coupled to a corresponding memory block BLK through a plurality of word lines WL. The block switch circuit may select one of the pass transistor groups included in the pass transistor circuit, in response to the row address X_A received from the peripheral circuit 123. The block switch circuit may include a plurality of block switches, which are coupled respectively to the pass transistor groups. As the row address X_A is received from the peripheral circuit 123, any one of the block switches may be activated in response to the received row address X_A. The activated block switch may transfer a signal, provided from the peripheral circuit 123, to a corresponding pass transistor group. The pass transistor group selected by the block switch circuit (i.e., provided with the signal from the block switch circuit) may transfer the operating voltage X_V to word lines WL that are coupled to a corresponding memory block BLK.

The page buffer circuit 122 may include a plurality of page buffers PB, which are coupled to the bit lines BL, respectively. The page buffers PB may receive a page buffer control signal PB_C from the peripheral circuit 123, and may transmit and receive a data signal DATA to and from the peripheral circuit 123. The page buffers PB may control the bit lines BL in response to the page buffer control signals PB_C. For example, the page buffers PB may detect data, stored in the memory cells of the memory cell array 110, by sensing the signals of the bit lines BL in response to the page buffer control signal PB_C, and may transmit the data signal DATA to the peripheral circuit 123 depending on the detected data. The page buffers PB may apply a signal to the bit lines BL, based on the data signal DATA received from the peripheral circuit 123, in response to the page buffer control signal PB_C, and thereby, may write data in the memory cells of the memory cell array 110. The page buffers PB may write data in or read data from memory cells that are coupled to an activated word line WL.

The peripheral circuit 123 may receive a command signal CMD, an address signal ADD and a control signal CTRL from outside the memory device 100, and may transmit and receive data DATA to and from a device outside the memory device 100, for example, a memory controller. The peripheral circuit 123 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages including the operating voltage X_V, which are required in the memory device 100.

As the degree of integration of the memory device 100 increases and the operating speed thereof increases, it is necessary to reduce a delay time caused by transferring an operating voltage from the row decoder 121 to the word lines WL. To this end, the row decoder 121 may be disposed to have a shape extending in a direction in which the word lines WL of the memory cell array 110 are arranged, and may have a length substantially the same as or similar to the memory cell array 110 in the direction in which the word lines WL are arranged.

Similarly as to the row decoder 121, as the degree of integration of the memory device 100 increases and the operating speed thereof increases, it is necessary to reduce a delay time of a signal applied to the bit lines BL by the page buffer circuit 122 or a signal provided to the page buffer circuit 122 through the bit lines BL. To this end, the page buffer circuit 122 may be disposed to have a shape extending in a direction in which the bit lines BL of the memory cell array 110 are arranged, and may have a length substantially the same as or similar to the memory cell array 110 in the direction in which the bit lines BL are arranged.

As the size of an electronic product in which the memory device 100 is mounted decreases, reduction in the size of the memory device 100 is continuously demanded. As the number of the word lines WL increases due to a demand for high capacity, the number of pass transistors of the row decoder 121 also increases. In consideration of these demands, pass transistors are disposed in a plurality of columns in an extending direction of the word lines WL. Due to this fact, as the length of the row decoder 121 in the extending direction of the word lines WL increases, the occupation area of the row decoder 121 also increases.

As the pitch of the bit lines BL decreases due to an increase in the degree of integration, the page buffers PB constituting the page buffer circuit 122 are disposed in the form of a matrix, and are disposed in a plurality of rows in an extending direction of the bit lines BL. Accordingly, the occupation area of the page buffer circuit 122 in the extending direction of the bit lines BL increases.

As such, as the size of the memory device 100 decreases and the occupation areas of the row decoder 121 and the page buffer circuit 122 increase, a demand for an efficient layout utilization method is increasing. Embodiments of the disclosure include a layout utilization method appropriate for the size reduction, high capacity and high degree of integration of the memory device 100.

Hereinbelow, in the accompanying drawings, two directions that are parallel to the top surface of a substrate and intersect with each other are defined as a first direction FD and a second direction SD, respectively, and a direction that vertically protrudes from the top surface of the substrate is defined as a vertical direction VD. For example, the first direction FD may correspond to the extending direction of word lines, and the second direction SD may correspond to the extending direction of bit lines. The first direction FD and the second direction SD may substantially perpendicularly intersect with each other. The vertical direction VD may correspond to a direction that is perpendicular to the first direction FD and the second direction SD. In the drawings, a direction indicated by an arrow and a direction opposite thereto represent the same direction.

Figure 2:
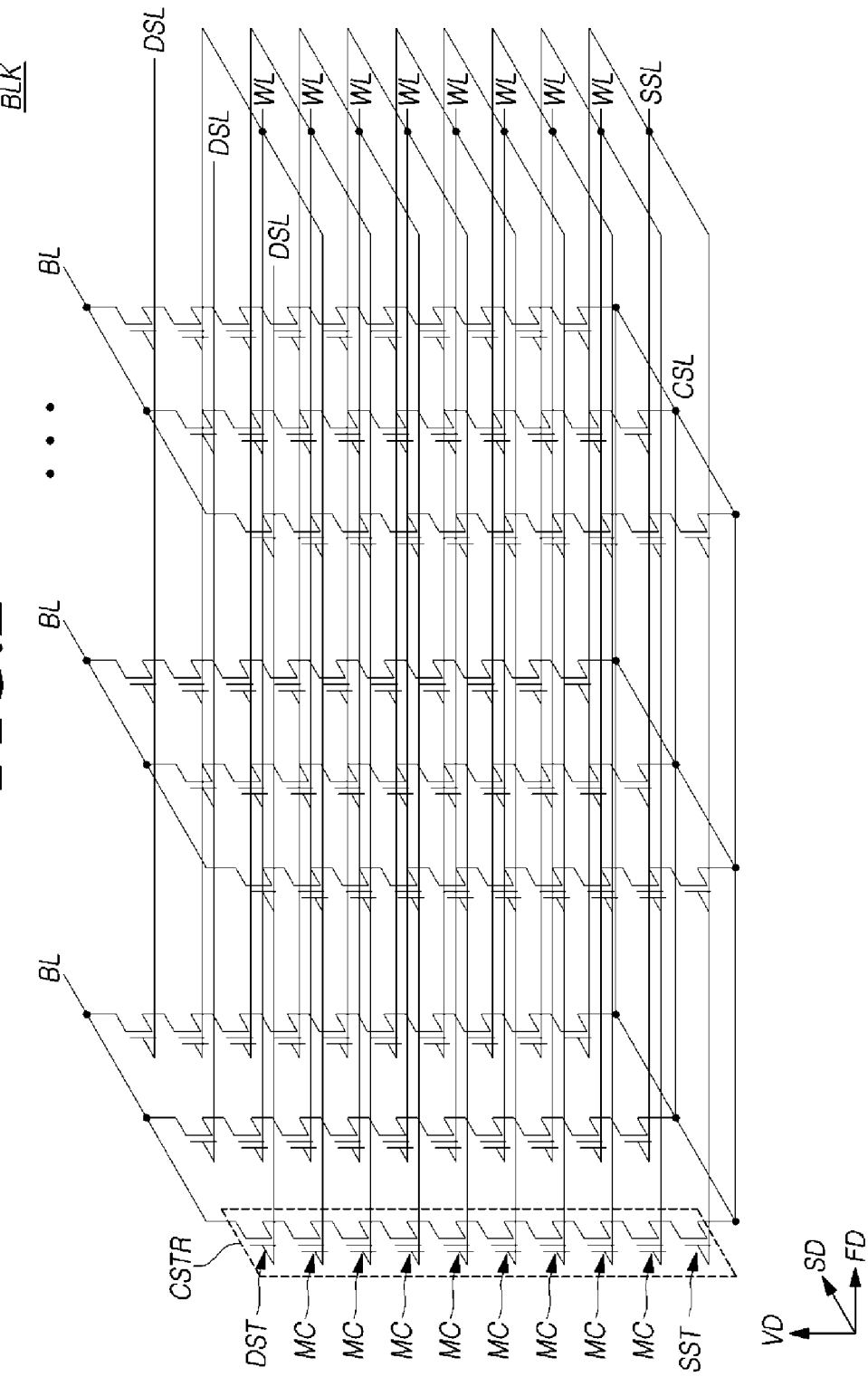
FIG. 2 is an equivalent circuit diagram illustrating a representation of an example of a memory block illustrated in FIG. 1.

FIG. 2 is an equivalent circuit diagram illustrating a representation of an example of a memory block BLK illustrated in FIG. 1.

Referring to FIG. 2, a memory block BLK may include a plurality of cell strings CSTR corresponding to a plurality of bit lines BL and to a common source line CSL. The bit lines BL may extend in a second direction SD, and may be arranged in a first direction FD. A plurality of cell strings CSTR may be coupled in parallel to each of the bit lines BL. The cell strings CSTR may be coupled in common to the common source line CSL. The plurality of cell strings CSTR may be coupled between the plurality of bit lines BL and the one common source line CSL.

Each of the cell strings CSTR may include a drain select transistor DST that is coupled to the bit line BL, a source select transistor SST that is coupled to the common source line CSL, and a plurality of memory cells MC that are coupled between the drain select transistor DST and the source select transistor SST. The drain select transistor DST, the memory cells MC and the source select transistor SST may be coupled in series in a third direction TD.

Drain select lines DSL, a plurality of word lines WL and a source select line SSL may be stacked between the bit lines BL and the common source line CSL in the third direction TD. Each of the drain select lines DSL may be coupled to the gates of corresponding drain select transistors DST. Each of the word lines WL may be coupled to the gates of corresponding memory cells MC. The source select line SSL may be coupled to the gates of source select transistors SST. Memory cells MC that are coupled in common to one word line WL may configure one page.

FIG. 3 is a top view illustrating a representation of an example of regions of a memory device in accordance with an embodiment of the disclosure.

Referring to FIG. 3, a memory device may be divided into a first cell region CR1, a second cell region CR2, a slimming region SR, a pad region PADR, and a peripheral region PR.

The pad region PADR may be disposed at an edge portion of the memory device and extend in the first direction FD. The slimming region SR may be disposed at the center portion of the memory device and extend in the second direction SD outside of the pad region PADR. The first cell region CR1 and the second cell region CR2 may be arranged on opposite sides of the slimming region SR in the first direction FD.

The peripheral region PR may be defined as a region remaining outside of the pad region PADR, the slimming region SR, the first cell region CR1 and the second cell region CR2.

Figure 4:
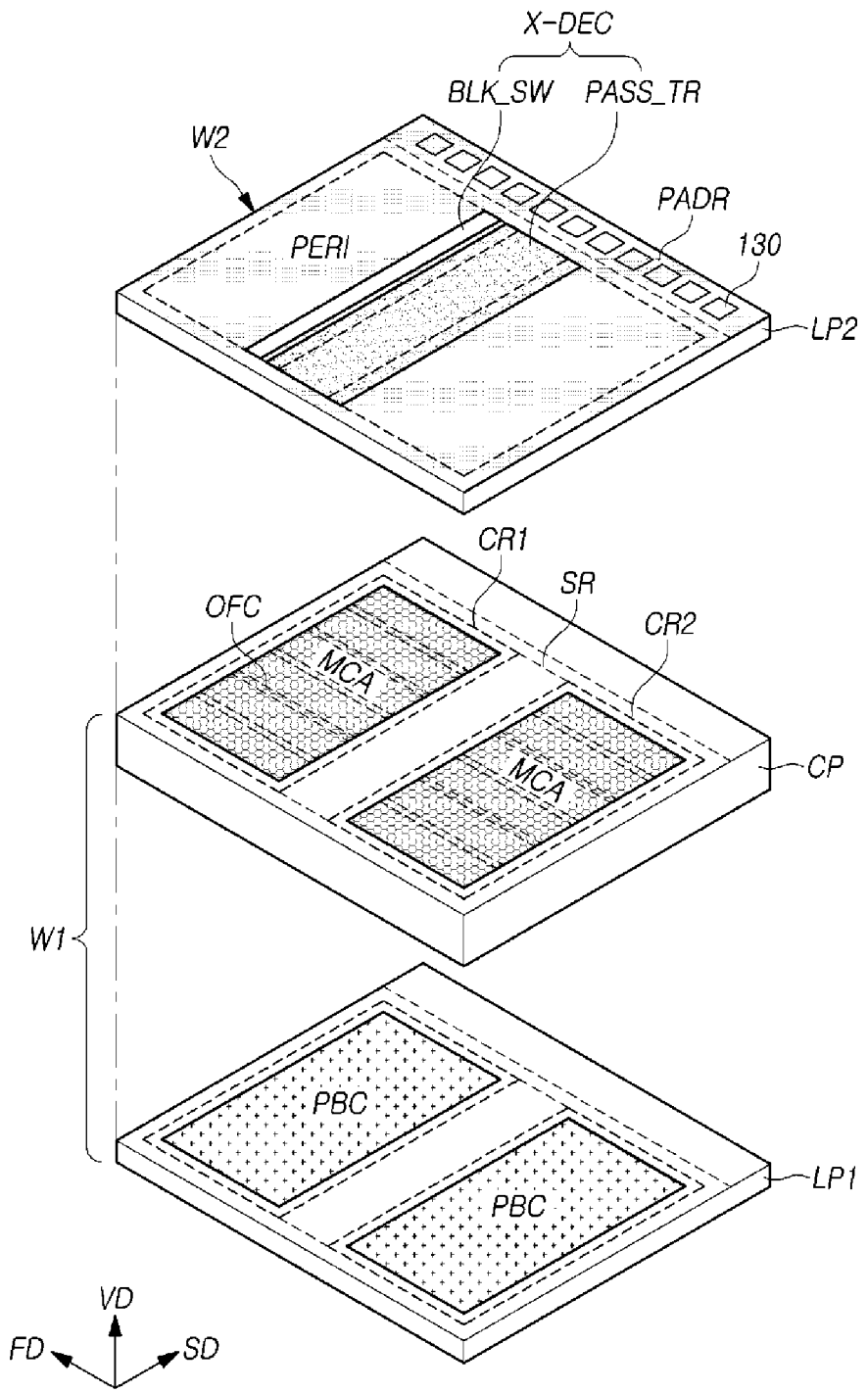
FIG. 4 is a view illustrating a representation of an example of the schematic structure of a memory device in accordance with an embodiment of the disclosure.

FIG. 4 is a view schematically illustrating a representation of an example of a memory device in accordance with an embodiment of the disclosure.

Referring to FIG. 4, a memory device in accordance with an embodiment of the disclosure may include a first wafer W1 and a second wafer W2, which are stacked in the vertical direction VD and are bonded to each other. The first wafer W1 may include a cell structure CP and a first logic structure LP1 that is disposed under the cell structure CP. The second wafer W2 may include a second logic structure LP2.

In order to facilitate understanding, FIG. 4 is an exploded view and illustrates that the first logic structure LP1 and the cell structure CP are separated from each other and that the first wafer W1 and the second wafer W2 are separated from each other. However, it should be understood that the top surface of the first logic structure LP1 and the bottom surface of the cell structure CP are in contact with each other, and that the top surface of the first wafer W1 and the bottom surface of the second wafer W2 are in contact with each other.

The cell structure CP may include a memory cell array MCA. The memory cell array MCA may configure the memory cell array 110 of FIG. 1. The memory cell array MCA may be disposed in a first cell region CR1 and a second cell region CR2 of the cell structure CP. Although not illustrated, the memory cell array MCA may include a plurality of word lines that extend in the first direction FD, a plurality of bit lines that extend in the second direction SD, and a plurality of memory cells, which are coupled to the plurality of word lines and the plurality of bit lines. While the present embodiment illustrates a memory cell array MCA that is divided and disposed in two cell regions CR1 and CR2, the number of cell regions in which the memory cell array MCA is disposed may be one or three or more.

Each of the first and second cell regions CR1 and CR2 may include through wiring regions OFC. The through wiring region OFC may be a region including a wiring structure that electrically couples the bit lines of the memory cell array MCA and a page buffer circuit PBC. FIG. 4 illustrates each of the first and second cell regions CR1 and CR2 including a plurality of through wiring regions OFC, but the number of through wiring regions OFC included in each of the first and second cell regions CR1 and CR2 may be one.

A slimming region SR may be a region including a wiring structure that electrically couples the word lines of the memory cell array MCA and a row decoder X-DEC.

The first logic structure LP1 may include the page buffer circuit PBC. The page buffer circuit PBC may configure the page buffer circuit 122 of FIG. 1. The page buffer circuit PBC may be disposed in the first and second cell regions CR1 and CR2 of the first logic structure LP1. The page buffer circuit PBC may overlap with the memory cell array MCA in the vertical direction VD.

The second logic structure LP2 may include the row decoder X-DEC and a peripheral circuit PERI. The row decoder X-DEC may configure the row decoder 121 of FIG. 1. The row decoder X-DEC may include a pass transistor circuit PASS_TR and a block switch circuit BLK_SW. The pass transistor circuit PASS_TR may be disposed in the slimming region SR and edge portions of the first and second cell regions CR1 and CR2, which are adjacent to the slimming region SR, to have a shape extending in the second direction SD. The block switch circuit BLK_SW may be disposed at one side of the pass transistor circuit PASS_TR to have a shape extending in the second direction SD.

Portions of the pass transistor circuit PASS_TR may overlap with the memory cell array MCA in the vertical direction VD. For instance, the pass transistor circuit PASS_TR may overlap with the memory cell array MCA in the vertical direction VD in the edge portions of the first and second cell regions CR1 and CR2, which are adjacent to the slimming region SR. The block switch circuit BLK_SW may overlap with the memory cell array MCA in the vertical direction VD.

Portions of the pass transistor circuit PASS_TR may overlap with the page buffer circuit PBC in the vertical direction VD. For instance, the pass transistor circuit PASS_TR may overlap with the page buffer circuit PBC in the vertical direction VD in the edge portions of the first and second cell regions CR1 and CR2, which are adjacent to the slimming region SR. A portion of the block switch circuit BLK_SW may overlap with the page buffer circuit PBC in the vertical direction VD.

The peripheral circuit PERI may configure the peripheral circuit 123 of FIG. 1. The peripheral circuit PERI may be disposed in one or more regions where the row decoder X-DEC is not disposed in the second logic structure LP2. Portions of the peripheral circuit PERI may overlap with the page buffer circuit PBC in the vertical direction VD. The portions of the peripheral circuit PERI may overlap with the memory cell array MCA in the vertical direction VD.

A plurality of external coupling pads 130 may be disposed in a pad region PADR and at the top surface of the second wafer W2. The external coupling pads 130 may correspond to external contacts of the memory device and may be used for coupling to an external device, for example, a memory controller. In the pad region PADR, the external coupling pads 130 may overlap with the peripheral circuit PERI, defined in the second wafer W2, in the vertical direction VD.

By disposing the page buffer circuit PBC in the first logic structure LP1 under the memory cell array MCA, and disposing the row decoder X-DEC in the second logic structure LP2 of the second wafer W2 above the memory cell array MCA, the memory device in accordance with an embodiment of the disclosure may improve layout utilization efficiency. In addition, by disposing the peripheral circuit PERI in a separate wafer from the page buffer circuit PBC, the memory device in accordance with the present embodiment may eliminate a limitation in disposing the peripheral circuit PERI, due to the presence of the page buffer circuit PBC.

Although the present embodiment illustrates a page buffer circuit PBC disposed in the first logic structure LP1 of the first wafer W1, and the row decoder X-DEC and the peripheral circuit PERI disposed in the second logic structure LP2 of the second wafer W2, the disclosure is not limited thereto. For example, the page buffer circuit PBC may be disposed in the second logic structure LP2 of the second wafer W2, and the row decoder X-DEC and the peripheral circuit PERI may be disposed in the first logic structure LP1 of the first wafer W1. As another example, the peripheral circuit PERI may be divided into a first peripheral circuit and a second peripheral circuit, and the first peripheral circuit and the second peripheral circuit may be disposed in the first logic structure LP1 and the second logic structure LP2, respectively. In another embodiment, the row decoder X-DEC may be divided into the pass transistor circuit PASS_TR and the block switch circuit BLK_SW, and the pass transistor circuit PASS_TR and the block switch circuit BLK_SW may be disposed in the first logic structure LP1 and the second logic structure LP2, respectively. These embodiments will become more apparent through the following descriptions.

Figure 5:
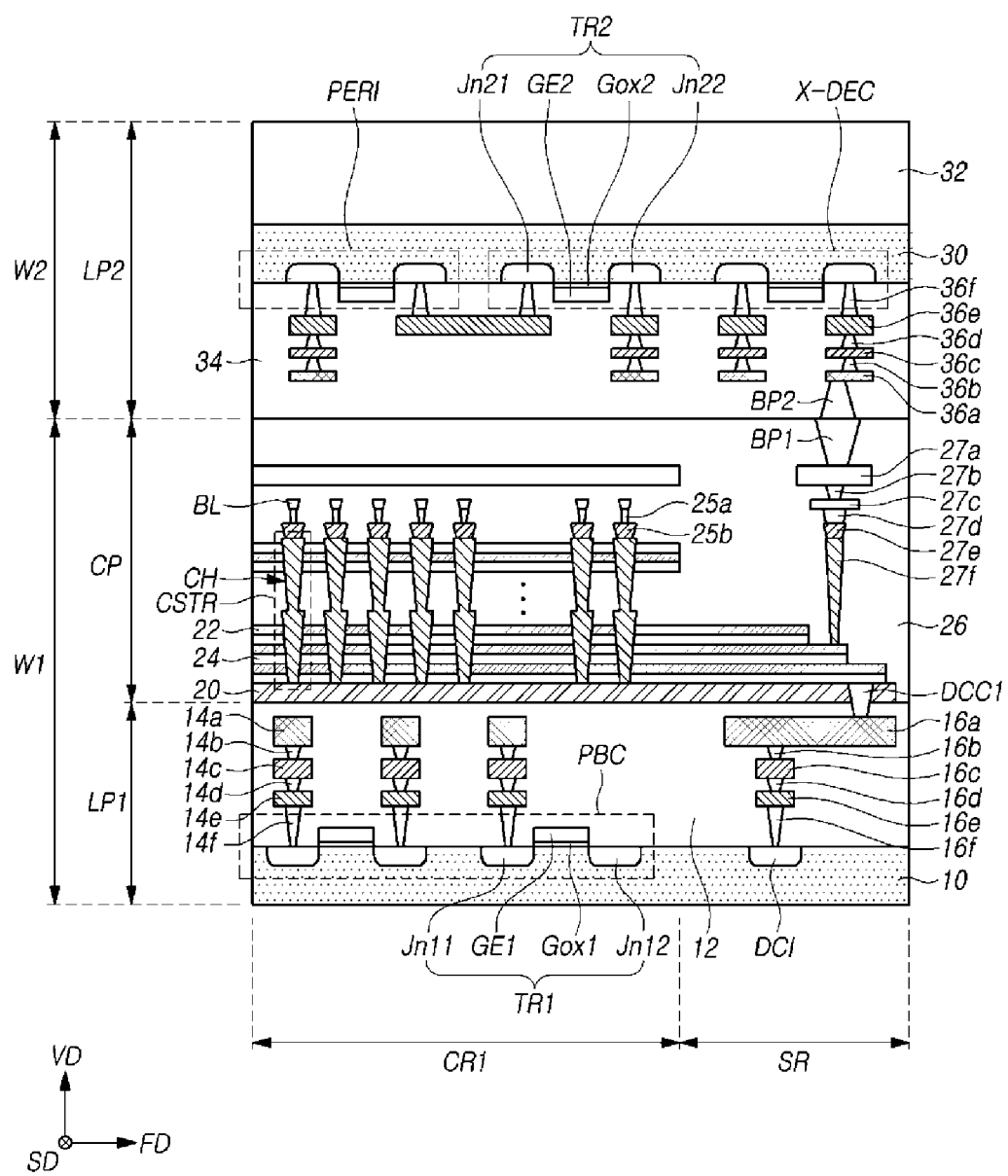
FIG. 5 is a cross-sectional view of a memory device of FIG. 4.
Figure 6:
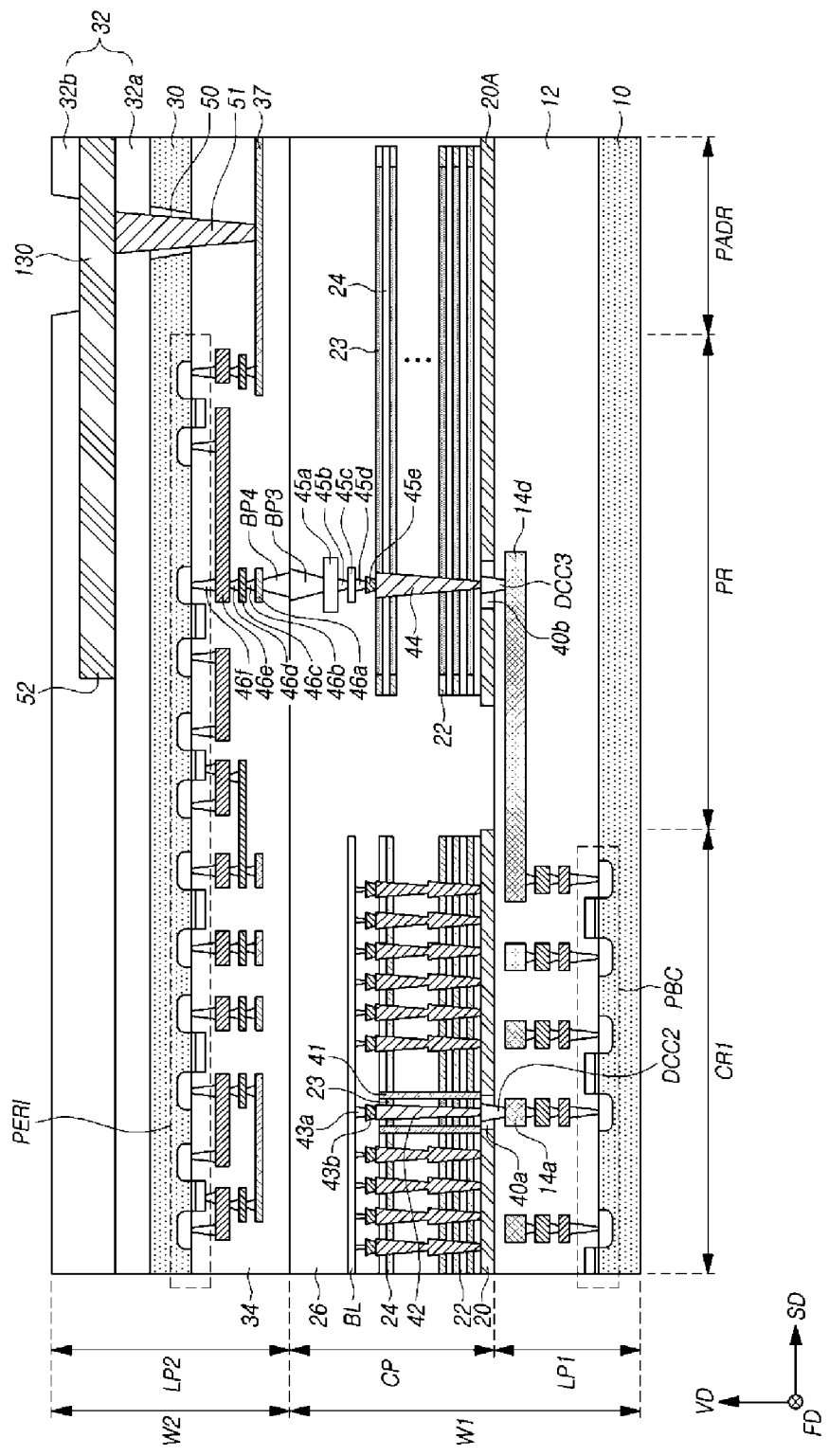
FIG. 6 is a cross-sectional view of a memory device of FIG. 5.

FIGS. 5 and 6 are cross-sectional views taken through a memory device of FIG. 4. FIG. 5 illustrates a cross-section taken through the first cell region CR1 and the slimming region SR in the first direction FD, and FIG. 6 illustrates a cross-section taken through the first cell region CR1, a peripheral region PR and the pad region PADR in the second direction SD. Hereinafter, it should be understood that drawings and descriptions for the first cell region CR1 are applied the same to the second cell region CR2.

Referring to FIG. 5, the memory device may include the first wafer W1 and the second wafer W2, which are stacked in the vertical direction VD. The first wafer W1 may include the first logic structure LP1 and the cell structure CP, which is disposed on the first logic structure LP1. The second wafer W2 may include the second logic structure LP2.

The first logic structure LP1 may include a first substrate 10 and the page buffer circuit PBC, which is defined on the first substrate 10. The first substrate 10 may have a top surface, which extends in the first direction FD and the second direction SD. The first substrate 10 may be a monocrystalline semiconductor film. For example, the first substrate 10 may be a bulk silicon substrate, a silicon-on-insulator substrate, a germanium substrate, a germanium-on-insulator substrate, a silicon-germanium substrate, or an epitaxial thin film formed through selective epitaxial growth.

The page buffer circuit PBC may be disposed in the first cell region CR1 of the first substrate 10. The page buffer circuit PBC may include a plurality of first horizontal transistors TR1. The first horizontal transistor TR1 may include a gate dielectric layer Gox1 that is disposed on the first substrate 10, a gate electrode GE1 that is disposed on the gate dielectric layer Gox1, and junctions Jn11 and Jn12 that are defined in an active region of the first substrate 10 on both sides of the gate electrode GE1. The junctions Jn11 and Jn12 are regions that are defined by implanting an N-type or P-type impurity into the active region of the first substrate 10. One of the junctions, Jn11 or Jn12, may be used as a source region of the first horizontal transistor TR1, and the other may be used as a drain region of the first horizontal transistor TR1.

A discharge impurity region DCI may be defined in the active region of the first substrate 10. The discharge impurity region DCI may include a conductivity type impurity which forms a PN diode. The discharge impurity region DCI may be used as a path for discharging charges accumulated in a source plate 20 of the cell structure CP.

A dielectric layer 12 may be defined on the first substrate 10 to cover the page buffer circuit PBC and the discharge impurity region DCI. A contact structure 14a to 14f may be defined in the dielectric layer 12 to be coupled to the page buffer circuit PBC.

The cell structure CP may include the source plate 20, and a plurality of electrode layers 22 and a plurality of interlayer dielectric layers 24 that are alternately stacked on the source plate 20.

The source plate 20 may be disposed on the dielectric layer 12 of the first logic structure LP1. The source plate 20 may have a top surface, which extends in the first direction FD and the second direction SD. The source plate 20 may include a semiconductor material, for example, a group IV semiconductor, a group III-V compound semiconductor or a group II-VI compound semiconductor. For example, the group IV semiconductor may include silicon, germanium or silicon-germanium. For example, the source plate 20 may be provided as a polycrystalline layer or an epitaxial layer.

The source plate 20 may be passed through by a conductive contact plug DCC1 and be electrically coupled to the conductive contact plug DCC1. The conductive contact plug DCC1 may be coupled to the discharge impurity region DCI of the first substrate 10 through a contact structure 16a to 16f, which is defined in the dielectric layer 12. The charges accumulated in the source plate 20 may be discharged to the first substrate 10 through the discharge impurity region DCI via the conductive contact plug DCC1 and the contact structure 16a to 16f.

The electrode layers 22 may include a conductive material. For example, the electrode layers 22 may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). Among the electrode layers 22, at least one electrode layer 22 when viewed from the lowermost electrode layer 22 may configure a source select line. Among the electrode layers 22, at least one electrode layer 22 when viewed from the uppermost electrode layer 22 may configure a drain select line. The electrode layers 22 between the source select line and the drain select line may configure word lines. The interlayer dielectric layers 24 may include silicon oxide.

The electrode layers 22 may extend from the first cell region CR1 to the slimming region SR in different lengths, thereby forming stairway-shaped steps in the slimming region SR. In the slimming region SR, the electrode layers 22 may be disposed to form the steps illustrated in FIG. 5 in the first direction FD. Although not illustrated, in the slimming region SR, the electrode layers 22 may be disposed to form steps even in the second direction SD.

In the stairway-shaped steps, an underlying electrode layer 22 extends longer into the slimming region SR than an overlying electrode layer 22 such that a contact pad region with an exposed upper surface may be defined in each of the electrode layers 22. A contact 27f of a contact structure 27a to 27f may be coupled to the contact pad region of the electrode layer 22.

A plurality of vertical channels CH that pass through the plurality of electrode layers 22 and the plurality of interlayer dielectric layers 24 in the vertical direction VD may be defined in the first cell region CR1. While not illustrated in detail, each of the vertical channels CH may include a channel layer and a gate dielectric layer. The channel layer may include polysilicon or monocrystalline silicon, and may include, in some regions thereof, a P-type impurity such as boron (B). The gate dielectric layer may have a shape which surrounds the outer wall of the channel layer. The gate dielectric layer may include a tunnel dielectric layer, a charge storage layer and a blocking layer which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked.

Source select transistors may be configured where the source select line surrounds the vertical channels CH. Memory cells may be configured in areas or regions where the word lines surround the vertical channels CH. Drain select transistors may be configured in areas or regions where the drain select line surrounds the vertical channels CH. The source select transistor, the plurality of memory cells and the drain select transistor disposed along one vertical channel CH may configure one cell string CSTR.

A plurality of bit lines BL may be disposed over a stack structure, which includes the plurality of electrode layers 22 and the plurality of interlayer dielectric layers 24 that are alternately stacked. The bit lines BL may extend in the second direction SD, and may be arranged in the first direction FD. The bit line BL may be coupled to the vertical channel CH through a contact structure 25a and 25b defined thereunder.

A dielectric layer 26 may be defined on the first logic structure LP1 to cover the source plate 20, the stack structure and the bit lines BL. The top surface of the dielectric layer 26 may constitute one surface of the first wafer W1, which is bonded to the second wafer W2.

The first wafer W1 may include a bonding pad BP1 on the one surface thereof. The bonding pad BP1 may be exposed on the top surface of the dielectric layer 26. The bonding pad BP1 may be coupled to the electrode layer 22 through a contact structure 27a to 27f, which is defined in the dielectric layer 26. Although only one bonding pad BP1 coupled to one electrode layer 22 is illustrated in FIG. 5 for the sake of simplicity in illustration, it should be understood that a plurality of bonding pads BP1, coupled respectively to the plurality of electrode layers 22, are defined on the one surface of the first wafer W1.

The second logic structure LP2 may include a second substrate 30, and the row decoder X-DEC and the peripheral circuit PERI, which are defined on the bottom surface of the second substrate 30.

The second substrate 30 may have an active surface, which extends in the first direction FD and the second direction SD, and a back surface that faces away from the active surface. FIG. 5 illustrates an active surface that is disposed to face down. The bottom surface of the second substrate 30 may correspond to the active surface, and the top surface of the second substrate 30 may correspond to the back surface. For example, the second substrate 30 may be a bulk silicon substrate, a silicon-on-insulator (SOI) substrate, a germanium substrate, a germanium-on-insulator (GOI) substrate, a silicon-germanium substrate, or an epitaxial thin film formed through selective epitaxial growth.

Each of the row decoder X-DEC and the peripheral circuit PERI may include a plurality of second horizontal transistors TR2. The second horizontal transistor TR2 may include a gate dielectric layer Gox2 that is disposed on the bottom surface of the second substrate 30, a gate electrode GE2 that is disposed on the gate dielectric layer Gox2, and junctions Jn21 and Jn22 that are disposed in an active region of the second substrate 30 on both sides of the gate electrode GE2. The junctions Jn21 and Jn22 are regions that are defined by implanting an N-type or P-type impurity into the active region of the second substrate 30. One of the junctions, Jn21 or Jn22, may be used as a source region of the second horizontal transistor TR2, and the other may be used as a drain region of the second horizontal transistor TR2.

The second horizontal transistors TR2, which are disposed in the slimming region SR of the second substrate 30 and in the edge portion of the first cell region CR1 of the second substrate 30 adjacent to the slimming region SR, may configure the row decoder X-DEC. The remaining second horizontal transistors TR2, except the second horizontal transistors TR2 that configure the row decoder X-DEC, may configure the peripheral circuit PERI.

A dielectric layer 32 may be defined on the top surface of the second substrate 30. A dielectric layer 34 may be defined on the bottom surface of the second substrate 30 to cover the row decoder X-DEC and the peripheral circuit PERI. The bottom surface of the dielectric layer 34 may constitute one surface of the second wafer W2, which is bonded to the first wafer W1. The second wafer W2 may include, on the one surface thereof, a bonding pad BP2, which is bonded to the bonding pad BP1 of the first wafer W1. The bonding pad BP2 may be coupled to the row decoder X-DEC through a contact structure 36a to 36f, which is defined in the dielectric layer 34. Although only one bonding pad BP2 is illustrated in FIG. 5 for the sake of simplicity in illustration, it should be understood that, similarly to the bonding pad BP1, a plurality of bonding pads BP2 are provided in correspondence to the plurality of electrode layers 22 included in the cell structure CP.

The second horizontal transistors TR2 that configure the peripheral circuit PERI and the row decoder X-DEC may include thin film transistors, low voltage transistors and high voltage transistors. The first horizontal transistors TR1 that configure the page buffer circuit PBC may include low voltage transistors and high voltage transistors, but not thin film transistors. The thickness of a gate dielectric layer is thickest in high voltage transistors, and thinner in low voltage transistors and yet thinner in thin film transistors.

The thickness of the gate dielectric layer Gox2, having a thinnest thickness among the gate dielectric layers Gox2 of the second horizontal transistors TR2 defined in the second logic structure LP2, will be thinner or smaller than the thickness of the gate dielectric layer Gox1 that has a thinnest thickness among the gate dielectric layers Gox1 of the first horizontal transistors TR1 defined in the first logic structure LP1. In addition, the number of types of the thickness of the gate dielectric layers Gox1 of the first horizontal transistors TR1 defined in the first logic structure LP1 will be smaller than the number of types of the thickness of the gate dielectric layers Gox2 of the second horizontal transistors TR2 defined in the second logic structure LP2.

As is well known, if a temperature rises above an allowable or threshold temperature, a functional error may occur in a horizontal transistor due to heat of a higher temperature. The allowable temperature of the horizontal transistor is lower when the thickness of a gate dielectric layer is thinner or smaller, and conversely, is higher when the thickness of the gate dielectric layer is thicker or larger.

The low voltage transistors and the high voltage transistors may not cause a functional error at a maximum temperature (hereinafter, referred to as a 'process critical temperature') in a process of forming the memory structure CP. Meanwhile, the thin film transistors may cause a functional error at the process critical temperature, but may operate at a high speed.

Because the second logic structure LP2 is fabricated on a separate wafer from the memory structure CP, the second logic structure LP2 is not exposed to heat in the process of forming the memory structure CP, whereas, since the first logic structure LP1 is formed on the same wafer as the memory structure CP before the memory structure CP is formed, the first logic structure LP1 is exposed to heat in the process of forming the memory structure CP. By disposing the peripheral circuit PERI and the row decoder X-DEC, including thin film transistors, in the second logic structure LP2 which is not exposed to heat in the process of forming the memory structure CP and disposing the page buffer circuit PBC, which does not include thin film transistors, in the first logic structure LP1, which is exposed to heat in the process of forming the memory structure CP, the memory device in accordance with present embodiment may suppress the occurrence of a functional error in a logic circuit due to heat in the process of forming the memory structure CP.

As a method for forming gate dielectric layers of different thicknesses on a single wafer, a method may be used in which a thick gate dielectric layer is formed on a substrate, then the thick gate dielectric layer that is defined in a thin gate dielectric layer forming region is removed, and then a gate dielectric layer of a thin thickness is additionally formed. In order to remove the thick gate dielectric layer defined in the thin gate dielectric layer forming region, a process of forming a mask pattern exposing the thin gate dielectric layer forming region, a process of etching the thick gate dielectric layer exposed by the mask pattern, and a strip process of removing the mask pattern remaining after the etching may be required. If the number of type of thickness of gate dielectric layers to be formed on a single wafer increases, the number of manufacturing steps for forming the gate dielectric layers will increase.

As is well known, if the number of manufacturing steps increases, manufacturing time and manufacturing cost may increase, and the probability for a failure to occur during a manufacturing process may increase. By disposing the peripheral circuit PERI and the row decoder X-DEC, including thin film transistors, low voltage transistors and high voltage transistors, in the second wafer W2 and disposing only the page buffer circuit PBC, including low voltage transistors and high voltage transistors and not including thin film transistors, in the first wafer W1, the memory device in accordance with the present embodiment may be configured such that the number of thicknesses of the gate dielectric layers Gox1 of the first horizontal transistors TR1 disposed in the first logic structure LP1 is smaller than the number of thicknesses of the gate dielectric layers Gox2 of the second horizontal transistors TR2 disposed in the second logic structure LP2. Therefore, it is possible to reduce the number of manufacturing steps required to form the gate dielectric layers Gox1 of the first wafer W1, thereby contributing to reducing manufacturing cost and reducing the occurrence of a failure during a manufacturing process.

Referring to FIG. 6, in the first cell region CR1, the source plate 20 may be disposed on the dielectric layer 12 of the first logic structure LP1. In the pad region PADR and the peripheral region PR, a dummy source plate 20A may be disposed on the dielectric layer 12 of the first logic structure LP1. The dummy source plate 20A may be formed at the same process step as the source plate 20, and may be formed of the same material as the source plate 20.

An isolation dielectric layer 40a, which passes through the source plate 20, may be defined in the first cell region CR1. A conductive contact plug DCC2, which is coupled to a wiring line 14a defined in the dielectric layer 12, may be defined through the isolation dielectric layer 40a.

In at least one of the pad region PADR and the peripheral region PR, an isolation dielectric layer 40b, which passes through the dummy source plate 20A, may be defined. A conductive contact plug DCC3, which is coupled to a wiring line 14d defined in the dielectric layer 12, may be defined through the isolation dielectric layer 40b. The wiring line 14a and the wiring line 14d may be electrically coupled to the page buffer circuit PBC.

The stack structure may be disposed on the source plate 20 and the isolation dielectric layer 40a in the first cell region CR1. An etch barrier 41, which passes through the stack structure, may be defined in the first cell region CR1. The etch barrier 41 may be configured to surround a portion of the stack structure. A region surrounded by the etch barrier 41 may correspond to the through wiring region OFC defined in FIG. 3. The stack structure may have different structures due to the presence of the etch barrier 41. In detail, in the through wiring region surrounded by the etch barrier 41, the stack structure may have a structure in which a plurality of dielectric layers 23 and the plurality of interlayer dielectric layers 24 are alternately stacked, and, outside the through wiring region, the stack structure may have a structure in which the plurality of electrode layers 22 and the plurality of interlayer dielectric layers 24 are alternately stacked.

After the plurality of dielectric layers 23 and the plurality of interlayer dielectric layers 24 are alternately stacked on the source plate 20, the dielectric layers 23 may be replaced with the electrode layers 22.

The dielectric layers 23 serving as sacrificial layers may be formed of a dielectric material that has an etching selectivity with respect to the interlayer dielectric layers 24. For example, the interlayer dielectric layers 24 may be silicon oxide, and the dielectric layers 23 may be silicon nitride. A process of replacing the dielectric layers 23 with the electrode layers 22 may be performed in such a way as to remove the dielectric layers 23 and fill an electrode material in spaces from which the dielectric layers 23 are removed. The etch barrier 41 may serve to block an etchant, used in the removal of the dielectric layers 23, from entering the through wiring region in the process of removing the dielectric layers 23. The etch barrier 41 may be formed of a dielectric material that has an etching selectivity with respect to the dielectric layers 23. For example, in the case where the dielectric layers 23 are silicon nitride, the etch barrier 41 may be silicon oxide.

In the pad region PADR and the peripheral region PR, a dummy stack structure may be defined on the dummy source plate 20A. When forming the stack structure, the dummy stack structure may be formed together with the stack structure.

In the process of removing the dielectric layers 23, as the etchant used in the removal of the dielectric layers 23 penetrates through the side surfaces of the dummy stack structure, the dielectric layers 23 may be removed at the peripheral portions of the dummy stack structure close to the side surfaces, and may not be removed and remain at the inside of the dummy stack structure distant from the side surfaces. Accordingly, the dielectric layers 23 may be replaced with the electrode layers 22 at the peripheral portions of the dummy stack structure close to the side surfaces, and may not be replaced with the electrode layers 22 at the inside of the dummy stack structure distant from the side surfaces. Therefore, the peripheral portions of the dummy stack structure may have a structure in which the electrode layers 22 and the interlayer dielectric layers 24 are alternately stacked, and the inside of the dummy stack structure surrounded by the peripheral portions may have a structure in which the dielectric layers 23 and the interlayer dielectric layers 24 are alternately stacked.

A via 42, which is coupled to the conductive contact plug DCC2, may be defined through the dielectric layers 23 and the interlayer dielectric layers 24 alternately stacked in the first cell region CR1. The bit line BL may be coupled to the via 42 through a contact structure 43a and 43b. The contact structure 43a and 43b and the via 42 may constitute an electrical path that couples the bit line BL and the page buffer circuit PBC.

A via 44, which is coupled to the conductive contact plug DCC3, may be defined through the dielectric layers 23 and the interlayer dielectric layers 24 alternately stacked in the peripheral region PR. The first wafer W1 may include a bonding pad BP3 on the one surface thereof. The bonding pad BP3 may be exposed on the top surface of the dielectric layer 26. The bonding pad BP3 may be coupled to the via 44 through a contact structure 45a to 45e. The contact structure 45a to 45e and the via 44 may constitute an electrical path that couples the bonding pad BP3 and the page buffer circuit PBC. Although the present embodiment illustrates a case where the via 44 and the bonding pad BP3 are disposed in the peripheral region PR, the via 44 and the bonding pad BP3 may be disposed in the pad region PADR.

The peripheral circuit PERI may be disposed on the bottom surface of the second substrate 30 of the second logic structure LP2 in the first cell region CR1, the peripheral region PR and the pad region PADR. The second wafer W2 may include a bonding pad BP4, which is bonded to the bonding pad BP3 of the first wafer W1, on the one surface thereof bonded to the first wafer W1. The bonding pad BP4 may be exposed on the bottom surface of the dielectric layer 34. The bonding pad BP4 may be coupled to the peripheral circuit PERI through a contact structure 46a to 46f. The contact structure 46a to 46f may constitute an electrical path that couples the bonding pad BP4 and the peripheral circuit PERI.

An isolation dielectric layer 50, which passes through the second substrate 30, may be defined in the pad region PADR. The isolation dielectric layer 50 may serve to insulate and isolate a plug 51 to be described below from the second substrate 30. The isolation dielectric layer 50 may be formed by forming a trench that passes through the second substrate 30, from the top surface of the second substrate 30, and filling a dielectric layer in the trench. The trench may have a side slope due to an etch loading during an etching process for forming the trench. Due to such a characteristic in process, the width of the isolation dielectric layer 50 may gradually narrow from the top surface to the bottom surface of the second substrate 30.

The top surfaces of the second substrate 30 and the isolation dielectric layer 50 may be covered with a dielectric layer 32a. The plug 51, which is coupled to a wiring line 37 in the dielectric layer 34, may be defined by passing through the dielectric layer 32a and the isolation dielectric layer 50 from the top surface of the dielectric layer 32a. The wiring line 37 may be electrically coupled to the peripheral circuit PERI.

Although the present embodiment illustrates the isolation dielectric layer 50 and the plug 51 disposed in the pad region PADR, the disclosure is not limited thereto. The isolation dielectric layer 50 and the plug 51 may be disposed anywhere in a region where a logic circuit (in the case of the present embodiment, the row decoder X-DEC and the peripheral circuit PERI) is not disposed, in the second substrate 30.

A wiring line 52 may be defined on the dielectric layer 32a and be coupled to the plug 51. A dielectric layer 32b may be defined on the dielectric layer 32a. The dielectric layer 32b may have an opening that exposes a portion of the wiring line 52 in the pad region PADR. The portion of the wiring line 52 that is exposed by the opening may configure the external coupling pad 130.

According to the embodiment described above with reference to FIGS. 4 to 6, because the page buffer circuit PBC is configured in the same wafer as the memory cell array MCA, bonding pads are not used in coupling the page buffer circuit PBC and the bit lines BL of the memory cell array MCA. Accordingly, since it is possible to reduce the number of bonding pads and manufacture the bonding pads in a larger size, a pad alignment margin may be improved when bonding wafers, thereby contributing to reducing the occurrence of a coupling failure between the bonding pads.

Figure 7:
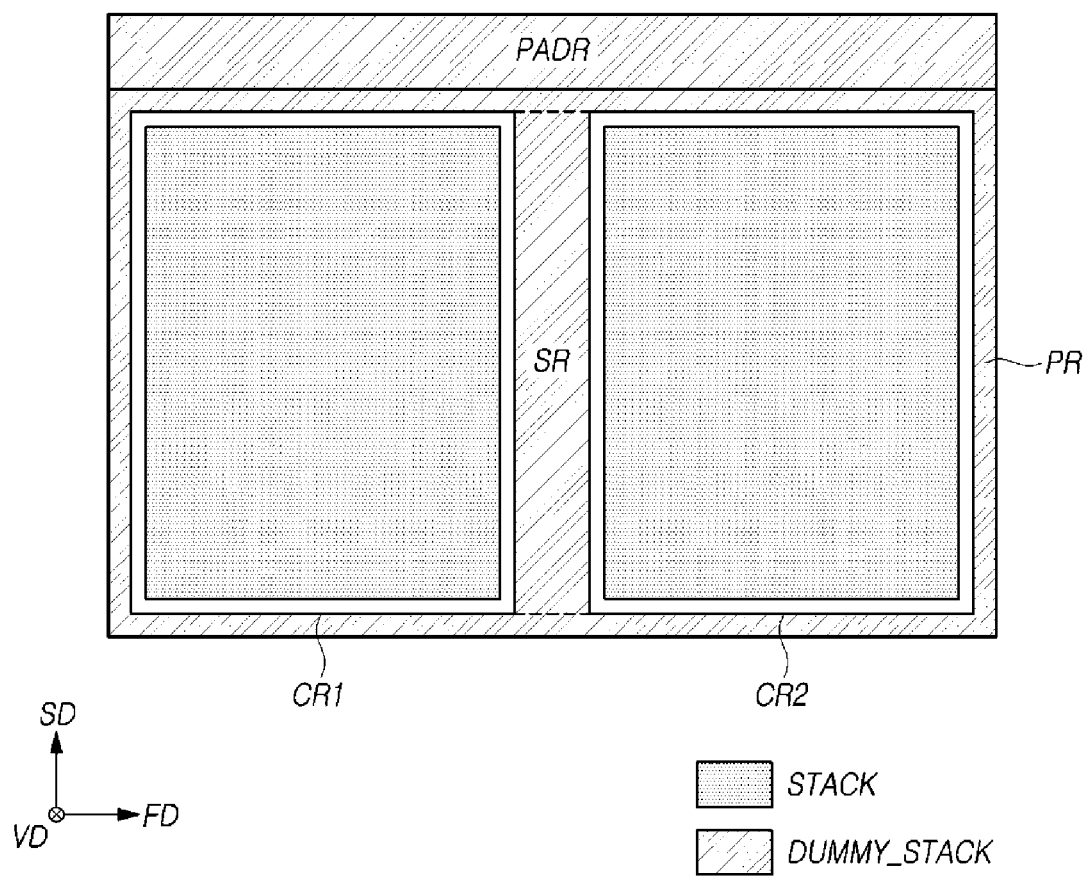
FIG. 7 is a top view illustrating a representation of an example of the layout of a stack structure and a dummy stack structure of FIGS. 5 and 6.

FIG. 7 is a top view illustrating a representation of an example of the layout of a stack structure and a dummy stack structure of FIGS. 5 and 6.

Referring to FIG. 7, a stack structure STACK may be disposed in the first cell region CR1 and the second cell region CR2. A dummy stack structure DUMMY_STACK may be disposed in the slimming region SR, the pad region PADR and the peripheral region PR. The stack structure STACK and the dummy stack structure DUMMY_STACK may be isolated by slits that are defined along the edges of the first cell region CR1 and the second cell region CR2.

By disposing the dummy stack structures DUMMY_S-TACK in the slimming region SR, the pad region PADR and the peripheral region PR where the formation of the stack structure STACK is not necessary, the height difference between the structure of the first and second cell regions CR1 and CR2 and the structure of the other regions SR, PADR and PR may be reduced. Therefore, it is possible to contribute to suppressing a failure that may occur in a subsequent process due to the height difference.

Figure 8:
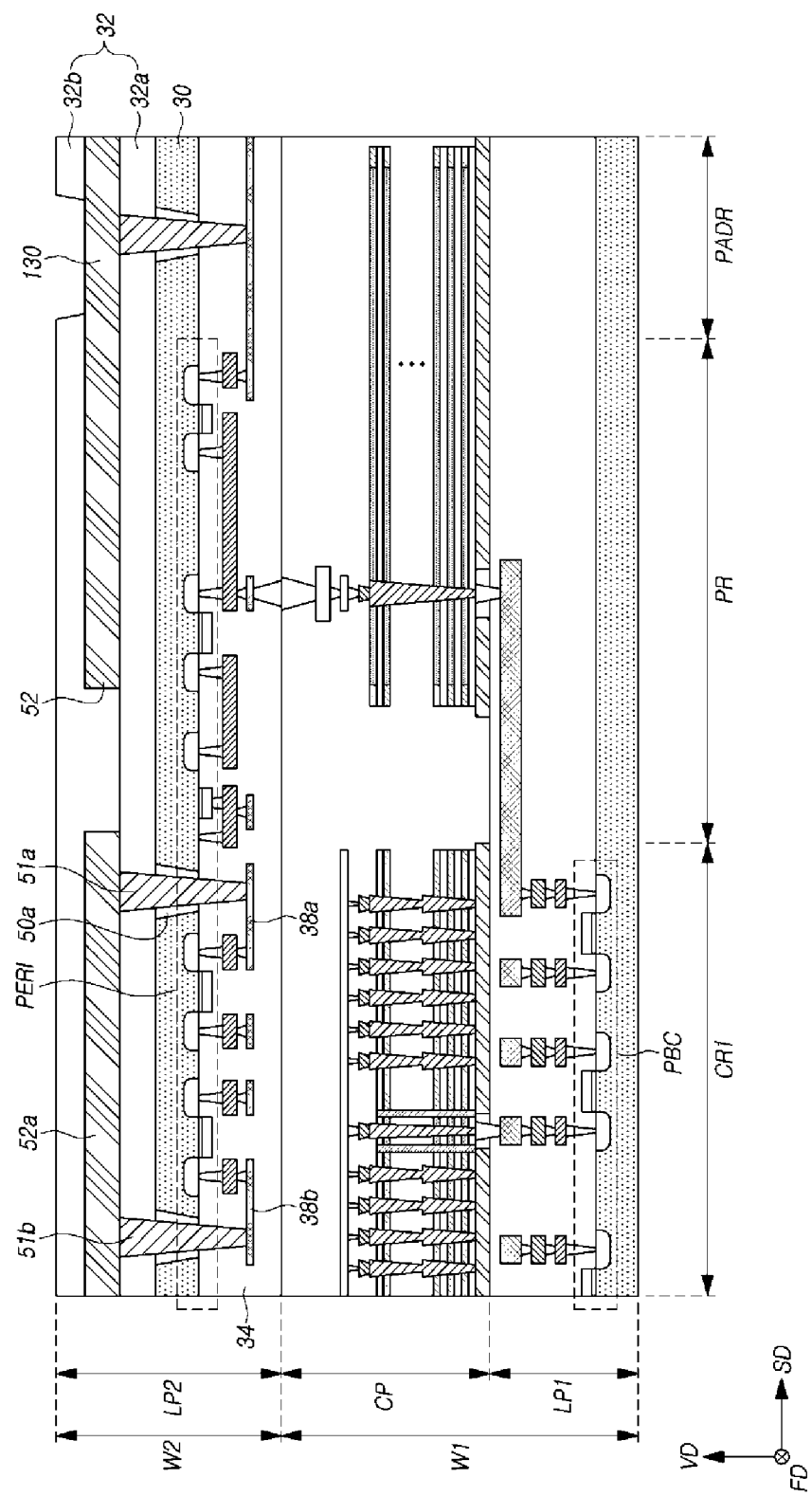
FIG. 8 is a cross-sectional view illustrating a representation of an example of a memory device in accordance with an embodiment of the disclosure.

FIG. 8 is a cross-sectional view taken through a memory device of FIG. 4. FIG. 8 illustrates a cross-section taken through the first cell region CR1, a peripheral region PR and the pad region PADR in the second direction SD.

Referring to FIG. 8, a wiring line 52a may be disposed in a wiring layer that is used in configuring the external coupling pad 130. The wiring line 52a may be disposed to overlap with the peripheral circuit PERI in the vertical direction VD. The wiring line 52a may be covered by the dielectric layer 32b.

Isolation dielectric layers 50a, which pass through the second substrate 30, may be defined. Plugs 51a and 51b, which are coupled to wiring lines 38a and 38b in the dielectric layer 34, may be defined through the dielectric layer 32a and the isolation dielectric layers 50a may be defined from the top surface of the dielectric layer 32a under the wiring line 52a. The wiring lines 38a and 38b may be electrically coupled to elements, respectively, which configure the peripheral circuit PERI. The wiring line 52a may provide an electrical path that couples the elements of the peripheral circuit PERI.

Although the present embodiment illustrates the wiring line 52a coupling the elements included in the peripheral circuit PERI, it is to be noted that the disclosure is not limited thereto. The wiring line 52a may be used in coupling elements included in the second logic structure LP2.

If the number of wiring layers used in disposing wiring lines increases, then the number of manufacturing steps required for forming the wiring lines increases. As a consequence, manufacturing time and manufacturing cost may increase, and the probability for a failure to occur during a manufacturing process may increase. According to the present embodiment, by configuring the wiring line 52a, which couples the elements included in the second logic structure LP2, using the wiring layer also used in configuring the external coupling pad 130, it is possible to reduce the number of wiring layers required for the disposition of the wiring lines used to couple the elements of the second logic structure LP2. Accordingly, by simplifying a process through reducing the number of manufacturing steps required for the formation of the wiring layers, manufacturing cost may be reduced, and the occurrence of a failure during a manufacturing process may be reduced.

Figure 9:
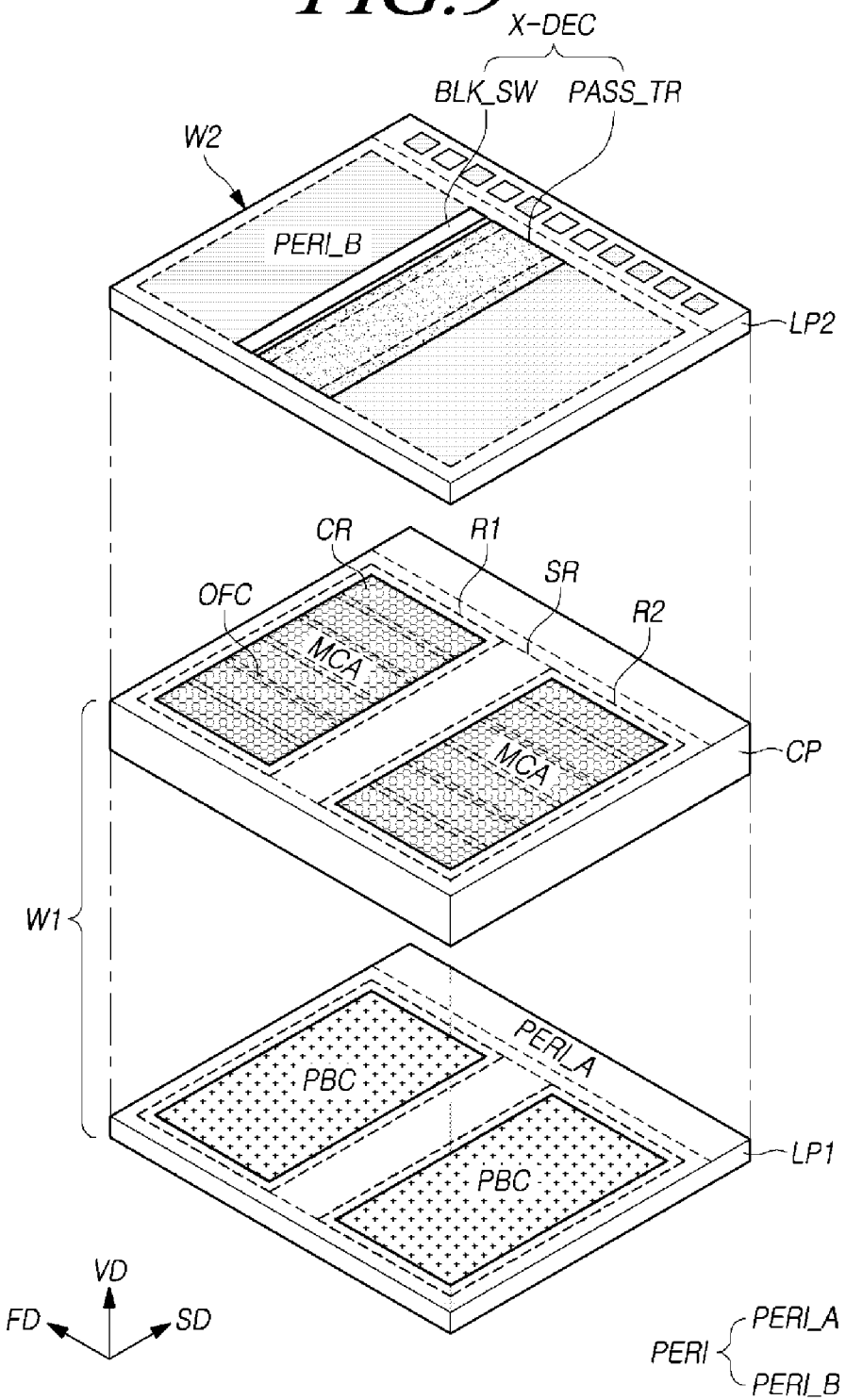
FIG. 9 is a view illustrating a representation of an example of the schematic structure of a memory device in accordance with an embodiment of the disclosure.

FIG. 9 is a view schematically illustrating a representation of an example of a memory device in accordance with an embodiment of the disclosure.

Referring to FIG. 9, compared to a device of FIG. 4, the peripheral circuit PERI may be divided into a first peripheral circuit PERI_A and a second peripheral circuit PERI_B, and may be disposed in the first logic structure LP1 of the first wafer W1 and the second logic structure LP2 of the second wafer W2.

The first peripheral circuit PERI_A may be disposed in a region where the page buffer circuit PBC is not disposed in the first logic structure LP1. A portion of the first peripheral circuit PERI_A may overlap with the row decoder X-DEC in the vertical direction VD. The second peripheral circuit PERI_B may be disposed in a region where the row decoder X-DEC is not disposed in the second logic structure LP2. A portion of the second peripheral circuit PERI_B may overlap with the page buffer circuit PBC in the vertical direction VD.

According to the present embodiment, by utilizing not only the first logic structure LP1 but also the second logic structure LP2 in disposing the peripheral circuit PERI, layout utilization efficiency may be improved.

Figure 10:
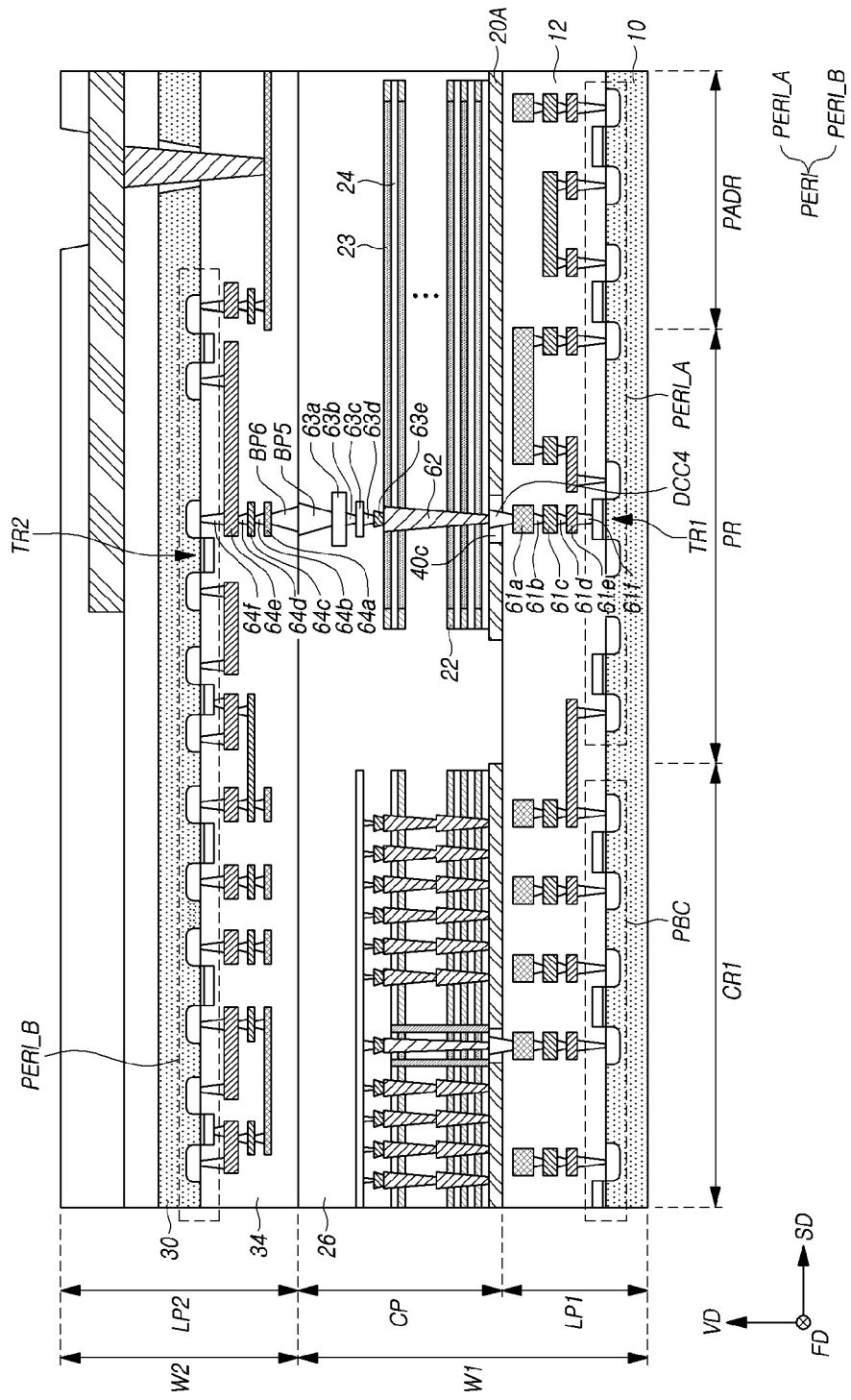
FIG. 10 is a cross-sectional view illustrating a part of FIG. 9.

FIG. 10 is a cross-sectional view illustrating a part of FIG. 9, and shows a cross-section taken through the first cell region CR1, the pad region PADR and the peripheral region PR in the second direction SD.

Referring to FIG. 10, the first peripheral circuit PERI_A may be disposed in the peripheral region PR and the pad region PADR of the first substrate 10 of the first logic structure LP1. The second peripheral circuit PERI_B may be disposed in the first cell region CR1, the peripheral region PR and the pad region PADR of the second substrate 30 of the second logic structure LP2. The first peripheral circuit PERI_A and the second peripheral circuit PERI_B may overlap with each other in the vertical direction VD in the peripheral region PR and the pad region PADR.

The peripheral circuit PERI may include thin film transistors, high voltage transistors and low voltage transistors. The thin film transistors included in the peripheral circuit PERI may be disposed in the second logic structure LP2 and may not be disposed in the first logic structure LP1. In this case, the first horizontal transistors TR1, which configure the first peripheral circuit PERI_A, may include low voltage transistors and high voltage transistors and may not include thin film transistors, and the second horizontal transistors TR2, which configure the second peripheral circuit PERI_B, may include low voltage transistors, high voltage transistors and thin film transistors. The first horizontal transistors TR1 that configure the page buffer circuit PBC may include low voltage transistors and high voltage transistors, and may not include thin film transistors. The second horizontal transistors TR2 which configure the row decoder X-DEC may include low voltage transistors, high voltage transistors and thin film transistors. Therefore, thin film transistors may be disposed only in the second logic structure LP2, and may not be disposed in the first logic structure LP1.

By distributing transistors included in the peripheral circuit PERI in the first logic structure LP1 and the second logic structure LP2, thin film transistors from among the transistors included in the peripheral circuit PERI are disposed only in the second logic structure LP2, which is not exposed to heat in a process of forming the memory structure CP. The thin film transistors are not disposed in the first logic structure LP1, which is exposed to the heat in the process of forming the memory structure CP. As a result, the memory device in accordance with the present embodiment may improve layout utilization efficiency and may reduce the occurrence of a functional error in the peripheral circuit PERI by heat in the process of forming the memory structure CP.

By distributing transistors included in the peripheral circuit PERI in the first logic structure LP1 and the second logic structure LP2, thin film transistors from among the transistors included in the peripheral circuit PERI are disposed only in the second wafer W2. The page buffer circuit PBC and the first peripheral circuit PERI_A, which include low voltage transistors and high voltage transistors and do not include thin film transistors, are disposed only in the first wafer W1. Thus, the memory device in accordance with the present embodiment may improve layout utilization efficiency, and at the same time, may reduce the number of manufacturing steps required to form the gate dielectric layers of the first wafer W1 so as to simplify a process, whereby it is possible to reduce manufacturing cost and suppress the occurrence of a failure during a manufacturing process.

As an alternative, the first peripheral circuit PERI_A may include a peripheral circuit that is associated with the page buffer circuit PBC, and the second peripheral circuit PERI_B may include a peripheral circuit that is associated with the row decoder X-DEC.

In the peripheral region PR, an isolation dielectric layer 40c, which passes through the dummy source plate 20A, may be defined. A conductive contact plug DCC4, which is coupled to a contact structure 61a to 61f defined in the dielectric layer 12, may be defined through the isolation dielectric layer 40c. The contact structure 61a to 61f may be coupled to the first peripheral circuit PERI_A. A via 62, which is coupled to the conductive contact plug DCC4, may be defined through, in the vertical direction VD, the plurality of dielectric layers 23 and the plurality of interlayer dielectric layers 24 alternately stacked on the dummy source plate 20A.

The first wafer W1 may include a bonding pad BP5 on the one surface thereof. The bonding pad BP5 may be exposed on the top surface of the dielectric layer 26. The bonding pad BP5 may be coupled to the via 62 through a contact structure 63a to 63e which is defined in the dielectric layer 26. The contact structure 63a to 63e, the via 62, the conductive contact plug DCC4 and the contact structure 61a to 61f may constitute an electrical path that couples the bonding pad BP5 and the first peripheral circuit PERI_A.

The second wafer W2 may include, on the one surface thereof bonded to the first wafer W1, a bonding pad BP6, which is bonded to the bonding pad BP5. The bonding pad BP6 may be exposed on the bottom surface of the dielectric layer 34. The bonding pad BP6 may be coupled to the second peripheral circuit PERI_B through a contact structure 64a to 64f which is defined in the dielectric layer 34.

Figure 11:
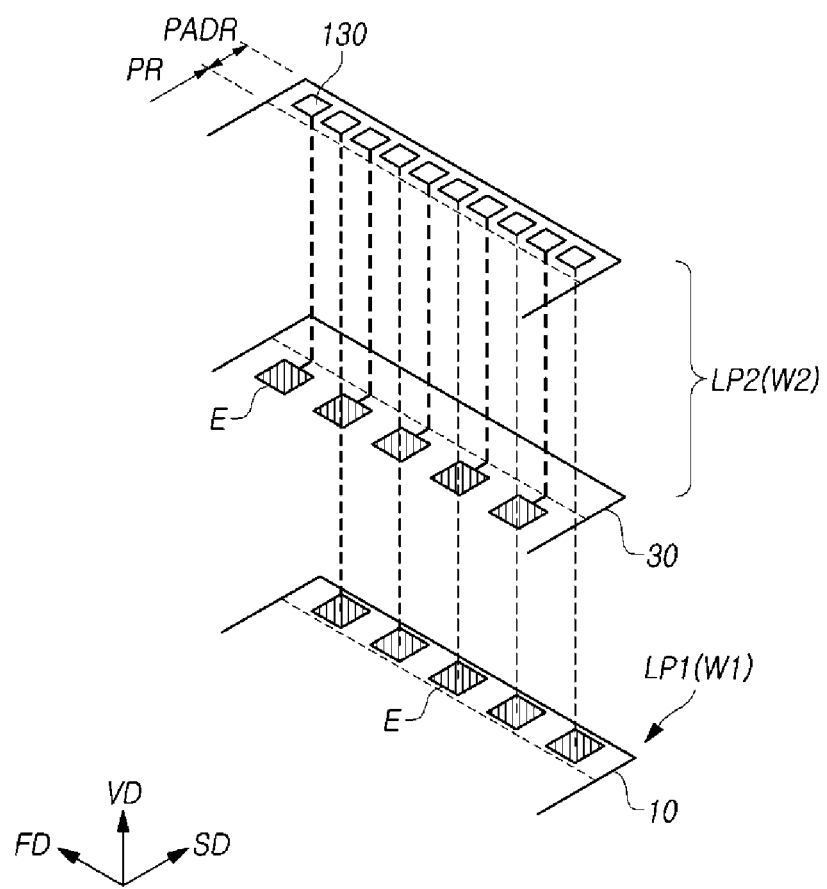
FIG. 11 is a view illustrating a representation of an example of the layout of electrostatic discharge (ESD) elements of a memory device in accordance with an embodiment of the disclosure.

FIG. 11 is a view illustrating a representation of an example of the layout of electrostatic discharge (ESD) elements of a memory device in accordance with an embodiment of the disclosure.

Referring to FIG. 11, a memory device may include a plurality of ESD elements E, which are coupled to a plurality of external coupling pads 130. The ESD elements E are coupled to the external coupling pads 130, and function to protect an internal circuit by discharging charges when a strong voltage is applied to the external coupling pad 130. In order to implement such a function, the ESD element E may have a larger planar size or area than the external coupling pad 130.

Some of the plurality of ESD elements E may be disposed on the second substrate 30 of the second logic structure LP2 in the peripheral region PR. The remaining ESD elements E may be disposed on the first substrate 10 of the first logic structure LP1 in the pad region PADR. By dividing the ESD elements E and disposing them on two substrates rather than one substrate, and by disposing some of the ESD elements E in the peripheral region PR, the memory device in accordance with the present embodiment may contribute to suppressing an increase in the area of the pad region PADR, in which the presence of fewer ESD elements E reduces the size of the pad region PADR.

Figure 12:
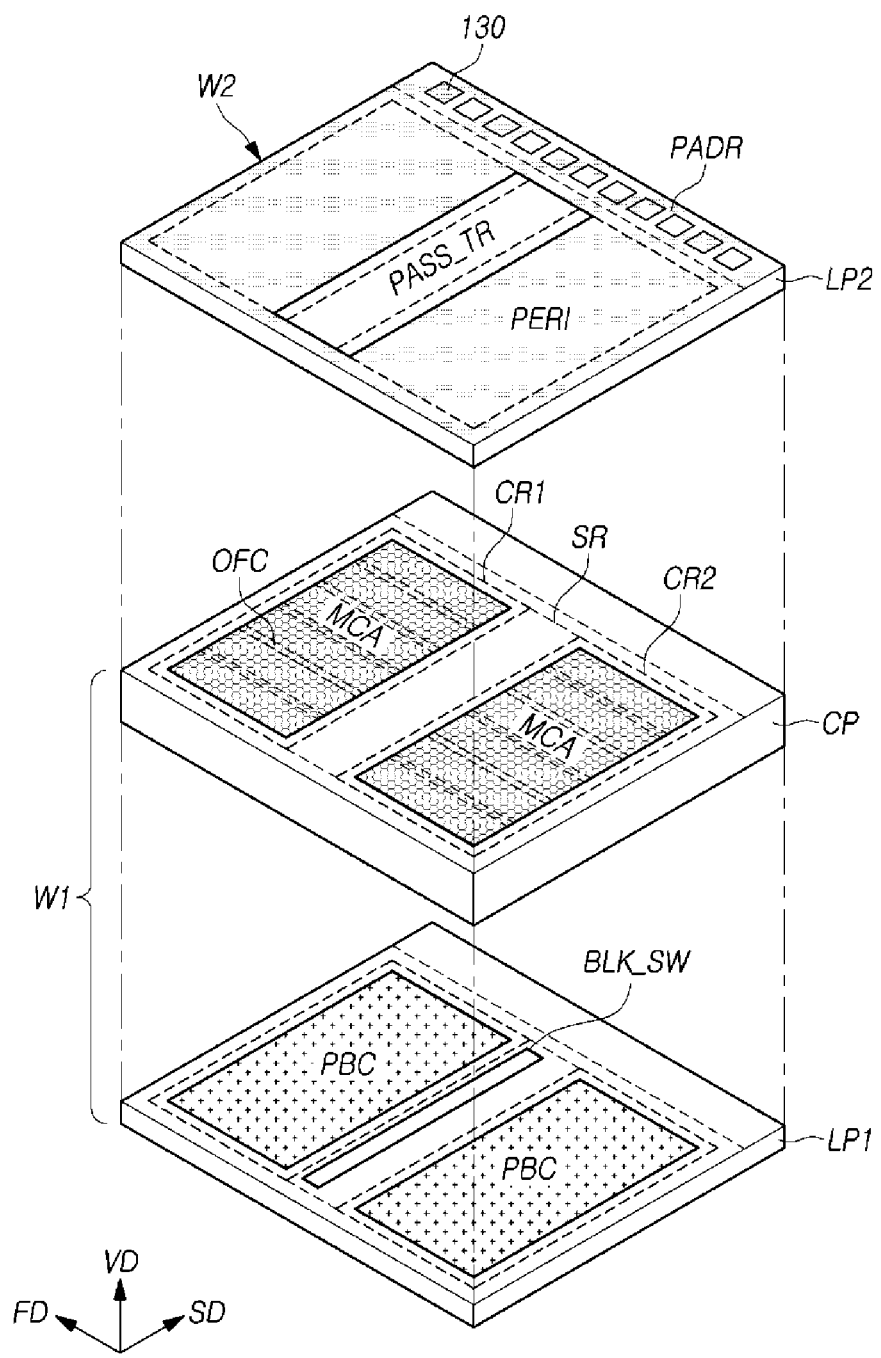
FIG. 12 is a view illustrating a representation of an example of the schematic structure of a memory device in accordance with an embodiment of the disclosure.

FIG. 12 is a view schematically illustrating a representation of an example of a memory device in accordance with an embodiment of the disclosure.

Referring to FIG. 12, a row decoder X-DEC may be divided into a pass transistor circuit PASS_TR and a block switch circuit BLK_SW, and may be disposed in a first logic structure LP1 of a first wafer W1 and a second logic structure LP2 of a second wafer W2. The pass transistor circuit PASS_TR may be disposed in the second logic structure LP2 of the second wafer W2, and the block switch circuit BLK_SW may be disposed in the first logic structure LP1 of the first wafer W1.

The pass transistor circuit PASS_TR may be disposed in a slimming region SR and edge portions of first and second cell regions CR1 and CR2, which are adjacent to the slimming region SR, to have a shape extending in the second direction SD. The block switch circuit BLK_SW may be disposed in the slimming region SR to have a shape extending in the second direction SD.

According to the present embodiment, by disposing the block switch circuit BLK_SW of the row decoder X-DEC in the first logic structure LP1, the occupation area of the row decoder X-DEC in the second logic structure LP2 may be reduced. Therefore, it is possible to increase the area of the second logic structure LP2 that may be utilized in disposing the peripheral circuit PERI.

Figure 13:
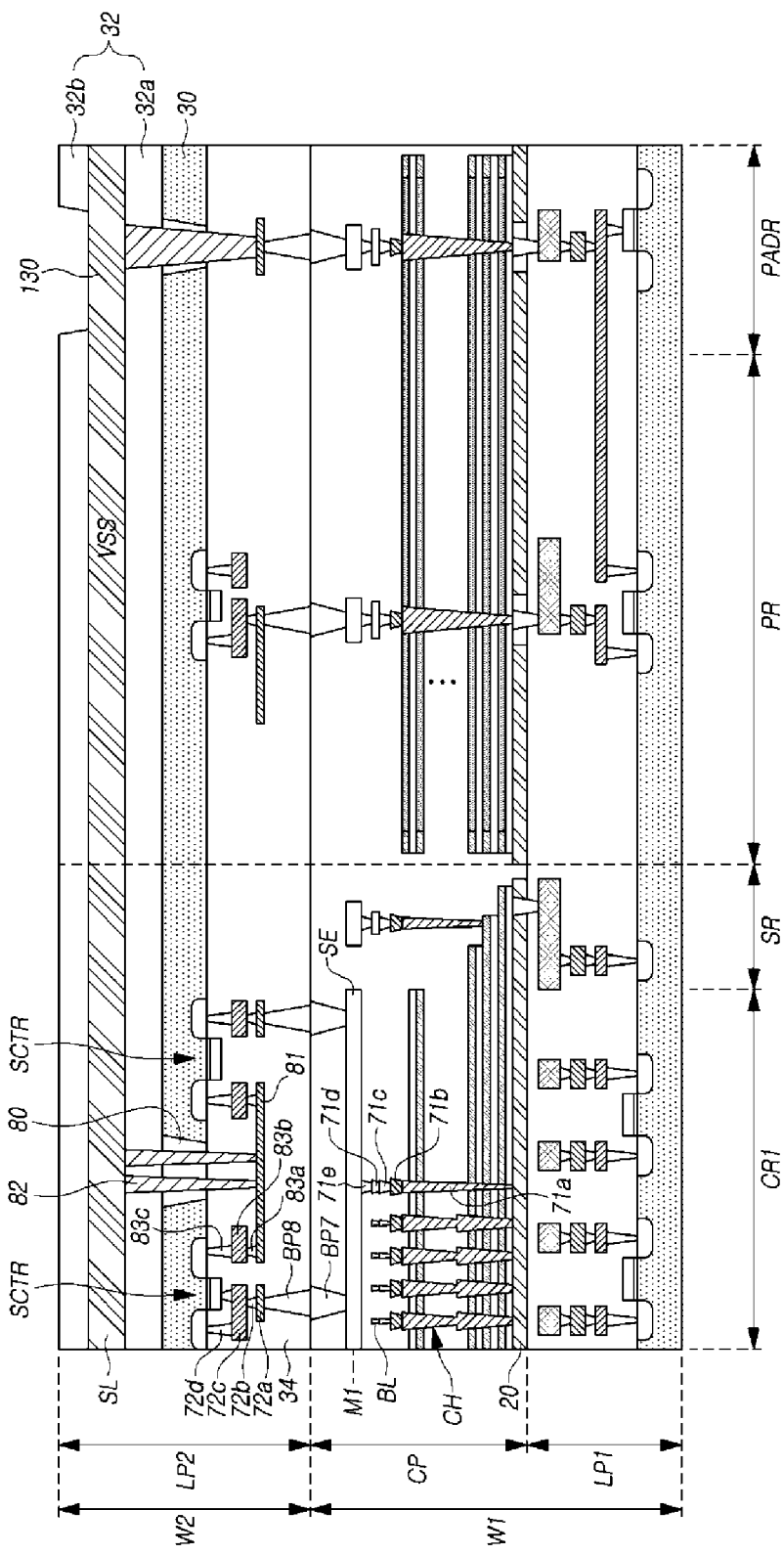
FIGS. 13 and 14 are cross-sectional views illustrating representations of examples of memory devices in accordance with embodiments of the disclosure.

FIG. 13 is a cross-sectional view taken through a memory device of FIG. 12. FIG. 13 is a view for facilitating the understanding of the disclosure, and it should be noted that FIG. 13 is not a cross-section taken in a specific direction. Specifically, in FIG. 13, the first cell region CR1 and the slimming region SR represents cross-sectional view in the first direction FD, and the peripheral region PR and pad region PADR cross-sectional view in the second direction SD.

Referring to FIG. 13, a source electrode SE may be disposed in a wiring layer M1 over the bit lines BL in the first cell region CR1. As aforementioned with reference to FIG. 6, because a wiring structure that couples the bit line BL and the page buffer circuit PBC is configured under the bit line BL, the wiring layer M1 over the bit lines BL in the first cell region CR1 may not be used to couple the bit line BL and the page buffer circuit PBC.

The source electrode SE may be disposed in the first cell region CR1 of the wiring layer M1 which is not otherwise used. The source electrode SE may be configured in a flat plate shape corresponding to the first cell region CR1. In the first cell region CR1, the source electrode SE may overlap with the source plate 20 in the vertical direction VD.

A contact structure 71a to 71e, which is coupled to the source plate 20 through the stack structure under the source electrode SE, may be defined to couple the source electrode SE and the source plate 20. While FIG. 13 illustrates only one contact structure 71a to 71e for the sake of simplicity in illustration, a plurality of contact structures may be coupled in parallel between the source electrode SE and the source plate 20.

The first wafer W1 may include a plurality of bonding pads BP7 on one surface thereof, which is bonded to the second wafer W2. The plurality of bonding pads BP7 may be coupled in common to one source electrode SE.

A plurality of source transistors SCTR may be defined on the bottom surface of the second substrate 30 of the second wafer W2. The second wafer W2 may include, on one surface thereof bonded to the first wafer W1, a plurality of bonding pads BP8, which are bonded to the bonding pads BP7, respectively.

Each of the bonding pads BP8 may be coupled to any one of source and drain regions of the source transistor SCTR through a contact structure 72a to 72d, which is defined in the dielectric layer 34. A source line SL may be defined on the dielectric layer 32a, which covers the top surface of the second substrate 30.

The source line SL may be configured using a wiring layer for configuring the external coupling pad 130, and may be disposed at the same layer as the external coupling pad 130. The source line SL may extend from the first cell region CR1 to the pad region PADR, and may be coupled to the external coupling pad 130 in the pad region PADR. The external coupling pad 130, which is coupled to the source line SL, may be an external coupling pad for a ground voltage VSS.

In the first cell region CR1, the source line SL may overlap with the source electrode SE in the vertical direction VD. An isolation dielectric layer 80 may be defined in the second substrate 30. The isolation dielectric layer 80 may pass through the second substrate 30 from the top surface of the second substrate 30. In the first cell region CR1, a plug 82, which is coupled to a wiring line 81 in the dielectric layer 34, may be defined under the source line SL and may pass through the dielectric layer 32a and the isolation dielectric layer 80. The wiring line 81 may be coupled to the other of the source and drain regions of the source transistor SCTR through a contact structure 83a to 83c.

As the plug 82, the wiring line 81, the contact structure 83a to 83c, the source transistor SCTR, the contact structure 72a to 72d and the bonding pads BP7 and BP8 are coupled in series between the source line SL and the source electrode SE, one electrical path may be constituted. A plurality of similar electrical paths may be coupled in parallel between the source line SL and the source electrode SE.

In a read operation or a verify operation, the ground voltage VSS from the source line SL is provided to the source plate 20, and ideally, the source plate 20 should be at a ground level. However, because the source plate 20 self-acts as a resistor and current directed to the source plate 20 through the vertical channels CH from the bit lines BL in the read operation or the verify operation is large, the potential of the source plate 20 may rise. This is referred to as a source line bouncing phenomenon. As a result, sensing current of a read target memory cell (or a verify target memory cell) may decrease because of the resistance of the source plate 20, and due to this fact, the memory cell may be recognized as a programmed cell even though the threshold voltage of the memory cell is lower than a read voltage (or a verify voltage). Accordingly, in the case of the read operation, a read fail, in which a memory cell not programmed is read as a programmed cell, may occur, and in the case of the verify operation, an under program, in which a memory cell not completely programmed is recognized as a completely programmed cell and thus is not programmed further in a next program operation, may occur.

The electrical path that couples the source line SL and the source electrode SE as described above may be disposed in the overlapping region between the source electrode SE and the source line SL. The contact structure 71a to 71e, which couples the source electrode SE and the source plate 20, may be disposed in the overlapping region between the source electrode SE and the source plate 20.

Because the source electrode SE may be configured in a flat plate shape corresponding to the first cell region CR1 by utilizing an unused region of the wiring layer M1 over the bit lines BL, it is possible to increase the overlapping area between the source electrode SE and the source line SL and the overlapping area between the source electrode SE and the source plate 20. Accordingly, it is possible to increase the number of electrical paths coupling the source line SL and the source electrode SE and the number of contact structures 71a to 71e coupling the source electrode SE and the source plate 20, and it is possible to reduce the spacing between the contact structures 71a to 71e coupled to the source plate 20. Consequently, it is possible to suppress the potential of the source plate 20 from rising due to the resistance of the source plate 20, thereby decreasing the occurrence of the source bouncing phenomenon.

Figure 14:
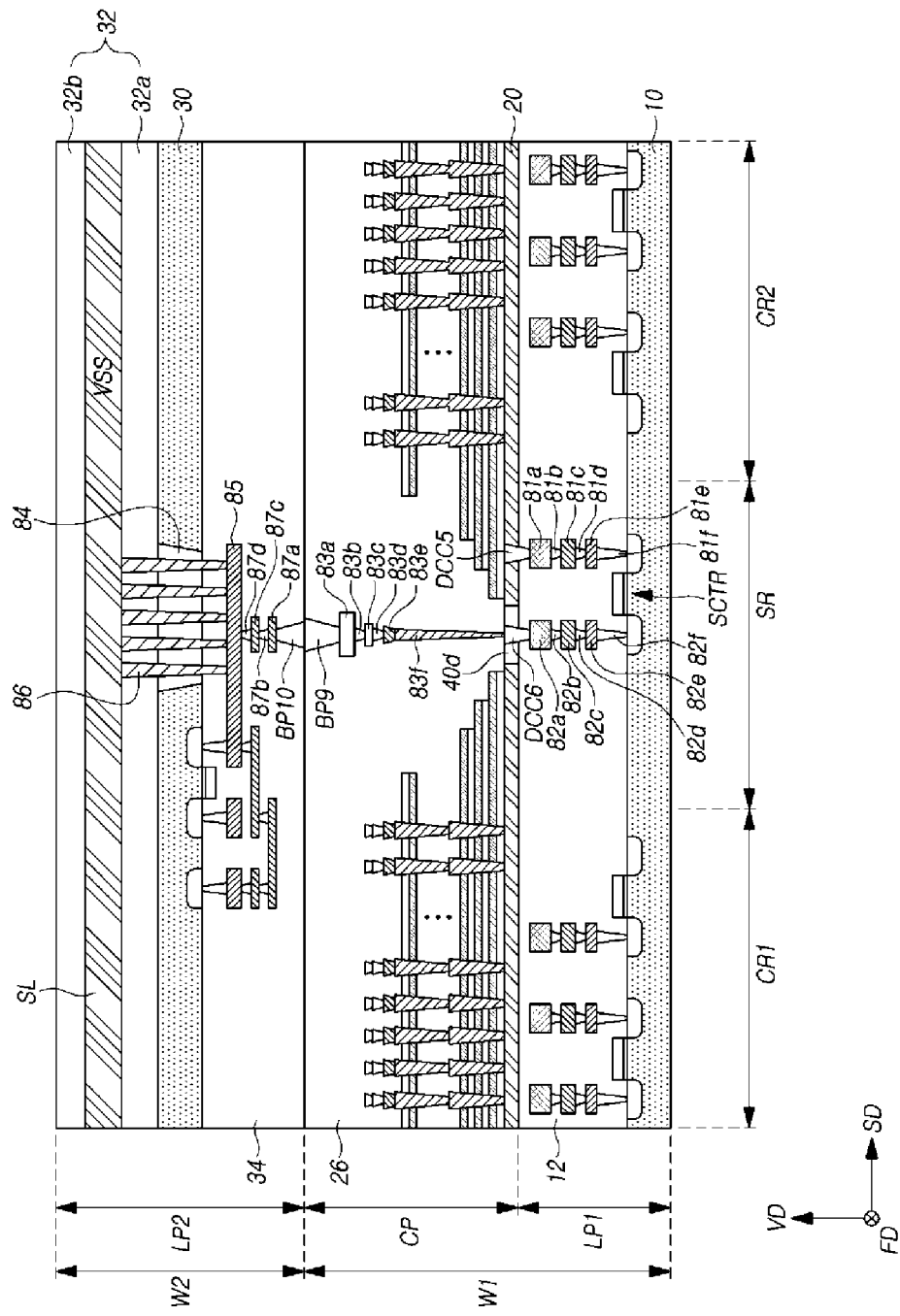

FIG. 14 is a cross-sectional view taken through a memory device of FIG. 12.

Referring to FIG. 14, a source transistor SCTR may be defined on the first substrate 10 of the first logic structure LP1. The source transistor SCTR may be disposed in the slimming region SR of the first substrate 10.

The source plate 20 may be passed through by a conductive contact plug DCC5 and be electrically coupled to the conductive contact plug DCC5. The conductive contact plug DCC5 may be coupled to one of source and drain regions of the source transistor SCTR through a contact structure 81a to 81f, which is defined in the dielectric layer 12.

In the slimming region SR, an isolation dielectric layer 40d, which passes through the source plate 20, may be defined. A conductive contact plug DCC6, which is coupled to a contact structure 82a to 82f, may be defined in the dielectric layer 12 and through the isolation dielectric layer 40d. The conductive contact plug DCC6 may be coupled to the other of the source and drain regions of the source transistor SCTR through the contact structure 82a to 82f.

The first wafer W1 may include a bonding pad BP9 on one surface thereof. The bonding pad BP9 may be exposed on the top surface of the dielectric layer 26. The bonding pad BP9 may be coupled to the conductive contact plug DCC6 through a contact structure 83a to 83f, which is defined in the dielectric layer 26. The conductive contact plug DCC5, the contact structure 81a to 81f, the source transistor SCTR, the contact structure 82a to 82f, the conductive contact plug DCC6 and the contact structure 83a to 83f may constitute an electrical path that electrically couples the bonding pad BP9 and the source plate 20.

The second logic structure LP2 may include a source line SL, which is defined on the dielectric layer 32a covering the top surface of the second substrate 30. In the slimming region SR, an isolation dielectric layer 84, which passes through the second substrate 30, may be defined under the source line SL. The isolation dielectric layer 84 may pass through the second substrate 30 from the top surface of the second substrate 30. A plug 86, which is coupled to a wiring line 85, may be defined in the dielectric layer 34 and pass through the dielectric layer 32a and the isolation dielectric layer 84 from the top surface of the dielectric layer 32a.

The second wafer W2 may include, on one surface thereof bonded to the first wafer W1, a bonding pad BP10, which is bonded to the bonding pad BP9. The bonding pad BP10 may be coupled to the wiring line 85 through a contact structure 87a to 87d, which is defined in the dielectric layer 34.

Figure 15:
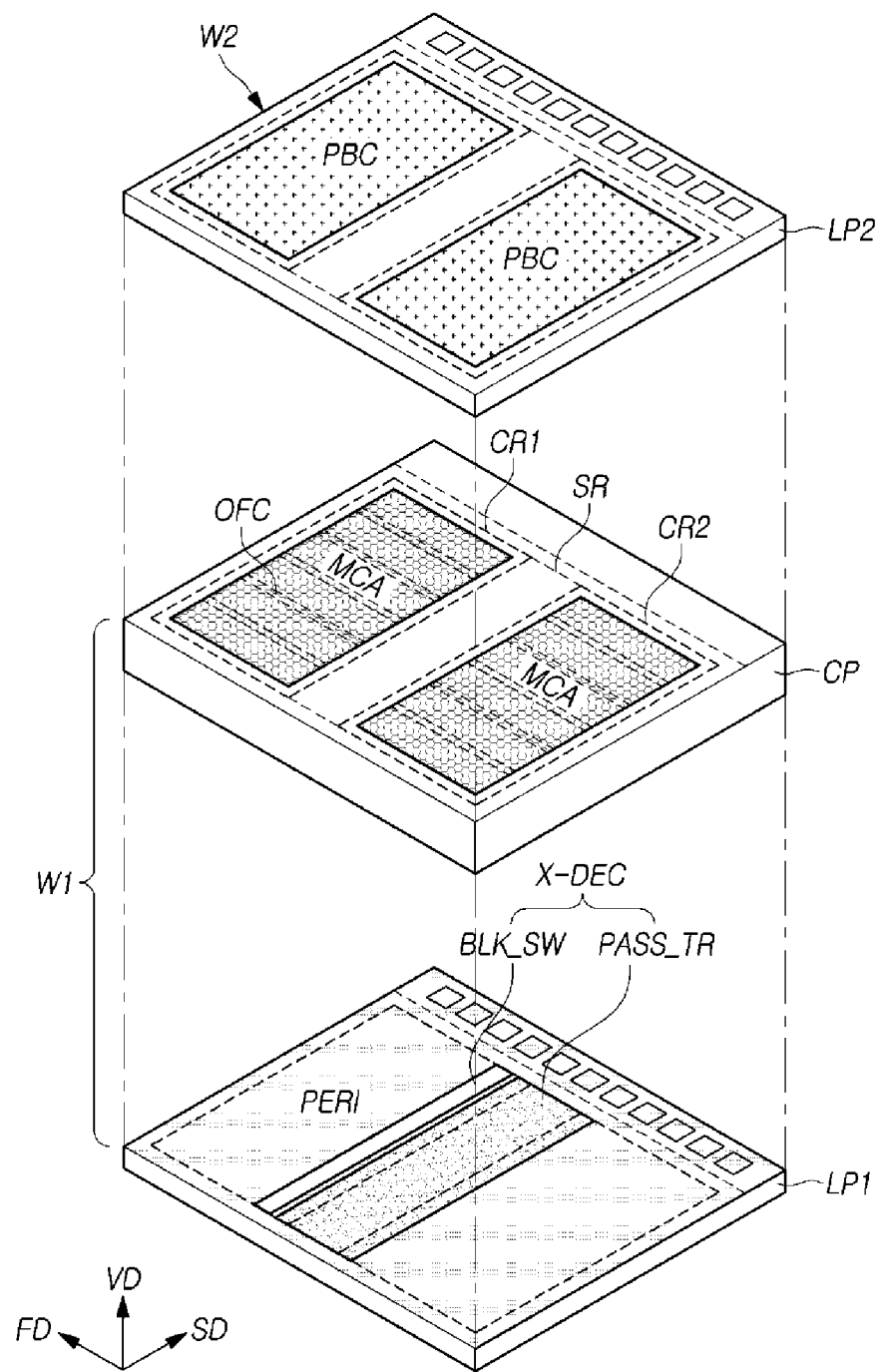
FIG. 15 is a view illustrating a representation of an example of the schematic structure of a memory device in accordance with an embodiment of the disclosure.

FIG. 15 is a view schematically illustrating a representation of an example of a memory device in accordance with an embodiment of the disclosure.

Referring to FIG. 15, a first logic structure LP1 may include a row decoder X-DEC and a peripheral circuit PERI. A second logic structure LP2 may include a page buffer circuit PBC.

A pass transistor circuit PASS_TR of the row decoder X-DEC may be disposed in a slimming region SR and edge portions of first and second cell regions CR1 and CR2, which are adjacent to the slimming region SR, of the first logic structure LP1, to have a shape extending in the second direction SD. A block switch circuit BLK_SW of the row decoder X-DEC may be disposed adjacent to the pass transistor circuit PASS_TR to have a shape extending in the second direction SD. The peripheral circuit PERI may be disposed in a region where the row decoder X-DEC is not disposed in the first logic structure LP1.

A page buffer circuit PBC may be disposed in the first and second cell regions CR1 and CR2 of the second logic structure LP2. The page buffer circuit PBC may overlap with a memory cell array MCA in the vertical direction VD over the memory cell array MCA. A portion of the page buffer circuit PBC may overlap with the row decoder X-DEC of the first logic structure LP1 in the vertical direction VD.

By disposing the page buffer circuit PBC in the second logic structure LP2 of the second wafer W2 over the memory cell array MCA, and by disposing the row decoder X-DEC in the first logic structure LP1 of the first wafer W1 under the memory cell array MCA, the memory device in accordance with the embodiment of the disclosure may improve layout utilization efficiency. In addition, by disposing the peripheral circuit PERI in a separate wafer from the page buffer circuit PBC, the memory device in accordance with the present embodiment may eliminate a limitation in disposing the peripheral circuit PERI, due to the presence of the page buffer circuit PBC.

Figure 16:
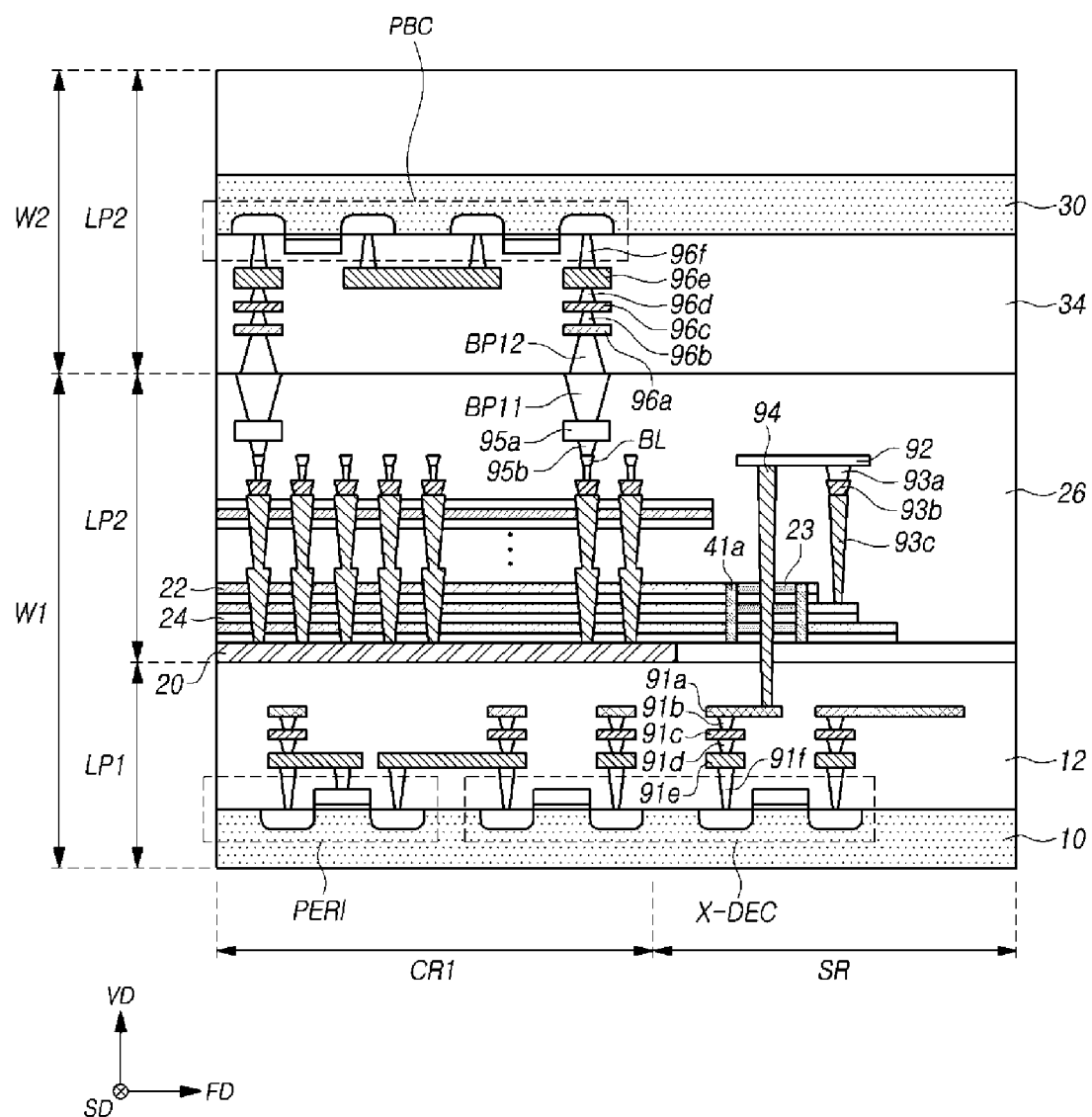
FIG. 16 is a cross-sectional view illustrating a part of FIG. 15.

FIG. 16 is a cross-sectional view illustrating a part of FIG. 15, and shows a cross-section taken through the first cell region CR1 and the slimming region SR in the first direction FD.

Referring to FIG. 16, the row decoder X-DEC and the peripheral circuit PERI may be disposed on the first substrate 10 of the first logic structure LP1. The row decoder X-DEC may be disposed in the slimming region SR and an edge portion of the first cell region CR1, which is adjacent to the slimming region SR. The peripheral circuit PERI may be disposed in a region where the row decoder X-DEC is not disposed.

The cell structure CP may include the source plate 20 and a stack structure, which is disposed on the source plate 20. The source plate 20 may not be disposed in the slimming region SR. The stack structure may include a plurality of electrode layers 22 and a plurality of interlayer dielectric layers 24, which are alternately stacked. The electrode layers 22 may extend from the first cell region CR1 to the slimming region SR in different lengths, thereby forming stairway-shaped steps in the slimming region SR.

An etch barrier 41a, which passes through the stack structure, may be defined in the slimming region SR. The etch barrier 41a may be configured to surround a portion of the stack structure in the slimming region SR. The stack structure may have different structures due to the presence of the etch barrier 41a. In detail, inside an area that is surrounded by the etch barrier 41a, the stack structure may have a structure in which the plurality of dielectric layers 23 and the plurality of interlayer dielectric layers 24 are alternately stacked, and, outside the etch barrier 41a, the stack structure may have a structure in which the plurality of electrode layers 22 and the plurality of interlayer dielectric layers 24 are alternately stacked.

A contact structure 91a to 91f, which is coupled to the row decoder X-DEC, may be defined in the dielectric layer 12. A wiring line 92, which is positioned over the step structure of the electrode layers 22, may be defined in the dielectric layer 26. The wiring line 92 may be disposed at the same layer as the bit lines BL. One end of the wiring line 92 may be coupled to a corresponding electrode layer 22 through a contact structure 93a to 93c. The other end of the wiring line 92 may be coupled to a via 94. The via 94 may be coupled to the contact structure 91a to 91f defined in the dielectric layer 12, and may pass through the plurality of dielectric layers 23 and the plurality of interlayer dielectric layers 24.

The contact structure 93a to 93c, the wiring line 92, the via 94 and the contact structure 91a to 91f may constitute an electrical path that couples the electrode layer 22 and the row decoder X-DEC. While FIG. 16 illustrates, for the sake of simplicity in illustration, that one electrode layer 22 is coupled to the row decoder X-DEC, it should be understood that the plurality of electrode layers 22 are coupled to the row decoder X-DEC through individual electrical paths, respectively.

Bonding pads BP11 may be defined on one surface of the first wafer W1. The bonding pad BP11 may be coupled to the bit line BL through a contact structure 95a and 95b, which is defined in the dielectric layer 26. While FIG. 16 illustrates, for the sake of simplicity in illustration, only the bonding pads BP11 that are coupled to some bit lines BL, it should be understood that a plurality of bonding pads BP11 that are coupled to the bit lines BL, respectively, are disposed on the one surface of the first wafer W1.

The page buffer circuit PBC may be defined on the bottom surface of the second substrate 30 of the second logic structure LP2. The page buffer circuit PBC may be disposed in the first cell region CR1 of the second substrate 30. A portion of the page buffer circuit PBC may overlap with the row decoder X-DEC in the vertical direction VD.

The second wafer W2 may include, on one surface thereof bonded to the first wafer W1, bonding pads BP12, which are bonded to the bonding pads BP11. The bonding pad BP12 may be coupled to the page buffer circuit PBC through a contact structure 96a to 96f, which is defined in the dielectric layer 34.

According to the embodiment described above with reference to FIGS. 15 and 16, because the row decoder X-DEC is configured in the same wafer as the memory cell array MCA, bonding pads may not be used in coupling the row decoder X-DEC and the electrode layers 22 of the memory cell array MCA. Accordingly, because it is possible to reduce the number of bonding pads and manufacture the bonding pads in a larger size, a pad alignment margin may be improved when bonding wafers, thereby contributing to suppressing the occurrence of a coupling failure between the bonding pads.

Figure 17:
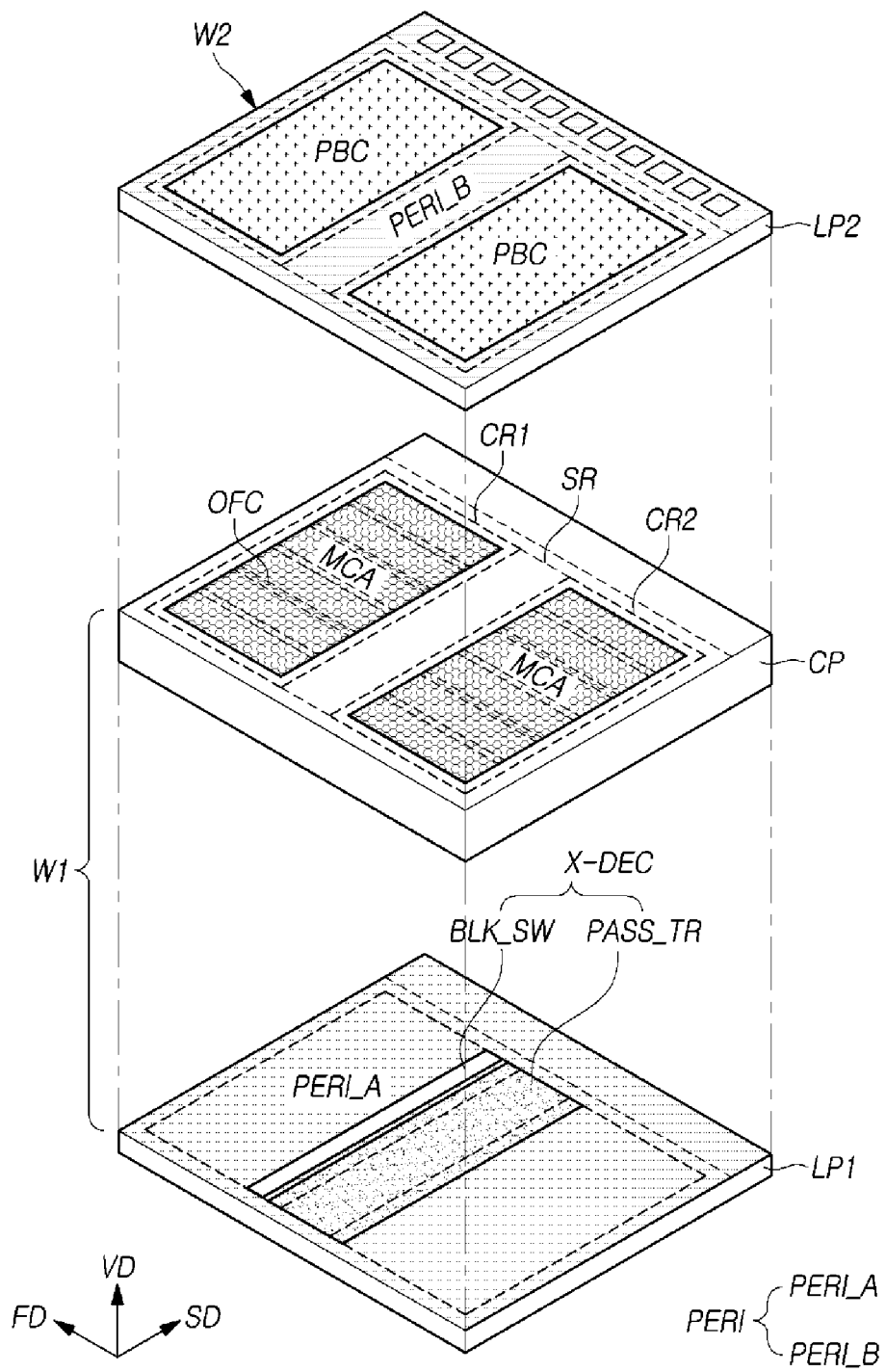
FIGS. 17 and 18 are views illustrating representations of examples of the schematic structures of memory devices in accordance with embodiments of the disclosure.

FIG. 17 is a view illustrating a representation of an example of schematic structures of a memory device in accordance with an embodiment of the disclosure.

Referring to FIG. 17, a peripheral circuit PERI may be divided into a first peripheral circuit PERI_A and a second peripheral circuit PERI_B, and may be disposed in a first logic structure LP1 of a first wafer W1 and a second logic structure LP2 of a second wafer W2.

A first peripheral circuit PERI_A may be disposed in a region where a row decoder X-DEC is not disposed in the first logic structure LP1. A portion of the first peripheral circuit PERI_A may overlap with a page buffer circuit PBC in the vertical direction VD. The second peripheral circuit PERI_B may be disposed in a region where a page buffer circuit PBC is not disposed in the second logic structure LP2. A portion of the second peripheral circuit PERI_B may overlap with the row decoder X-DEC in the vertical direction VD.

As described above with reference to FIG. 10, horizontal transistors that configure the row decoder X-DEC and the page buffer circuit PBC may include low voltage transistors and high voltage transistors. Horizontal transistors that configure the peripheral circuit PERI may include thin film transistors, low voltage transistors, and high voltage transistors.

The first peripheral circuit PERI_A, which is disposed in the first logic structure LP1, may include at least ones of low voltage transistors and high voltage transistors, and may not include thin film transistors. The second peripheral circuit PERI_B, which is disposed in the second logic structure LP2, may include thin film transistors, low voltage transistors, and high voltage transistors. Thin film transistors that configure the peripheral circuit PERI may be disposed in the second logic structure LP2.

According to the present embodiment, by utilizing not only the first logic structure LP1 but also the second logic structure LP2 in disposing the peripheral circuit PERI, layout utilization efficiency may be improved. Further, by disposing the thin film transistors of the peripheral circuit PERI not in the first logic structure LP1 but only in the second logic structure LP2, the occurrence of a functional error in the thin film transistors due to heat in a process of forming the memory structure CP may be prevented. In addition, by disposing the first peripheral circuit PERI_A and the row decoder X-DEC, which do not include thin film transistors, in the first wafer W1, the memory device in accordance with the present embodiment may simplify a process by reducing the number of manufacturing processes required for forming the gate dielectric layers of the first wafer W1. Consequently, it is possible to reduce a manufacturing cost and contribute to suppressing the occurrence of a failure during a manufacturing process.

As an alternative, the first peripheral circuit PERI_A may include a peripheral circuit, which is associated with the row decoder X-DEC, and the second peripheral circuit PERI_B may include a peripheral circuit, which is associated with the page buffer circuit PBC.

Figure 18:
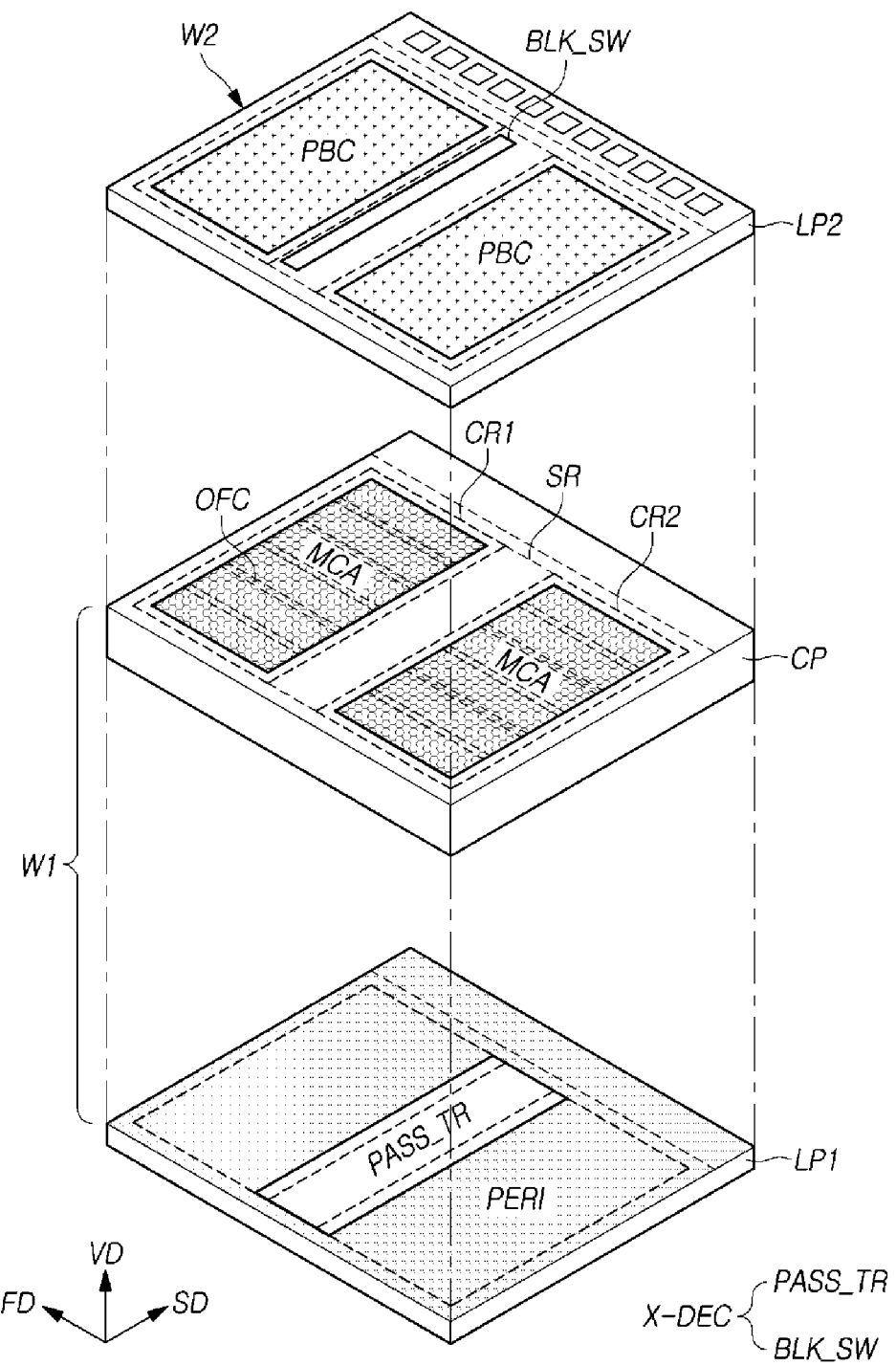

FIG. 18 is a view illustrating a representation of an example of schematic structures of a memory device in accordance with an embodiment of the disclosure.

Referring to FIG. 18, a pass transistor circuit PASS_TR of a row decoder X-DEC and a peripheral circuit PERI may be disposed in a first logic structure LP1 of a first wafer W1, and a block switch circuit BLK_SW of the row decoder X-DEC and a page buffer circuit PBC may be disposed in a second logic structure LP2 of a second wafer W2.

The pass transistor circuit PASS_TR may be disposed in the slimming region SR of the first logic structure LP1 and edge portions of first and second cell regions CR1 and CR2 of the first logic structure LP1, which are adjacent to a slimming region SR, to have a shape extending in the second direction SD. The block switch circuit BLK_SW may be disposed in the slimming region SR of the second logic structure LP2 to have a shape extending in the second direction SD.

According to the present embodiment, by disposing the block switch circuit BLK_SW of the row decoder X-DEC in the second logic structure LP2, the area occupied by the row decoder X-DEC in the first logic structure LP1 may be reduced. Therefore, it is possible to increase the area of the first logic structure LP1 that may be utilized in disposing the peripheral circuit PERI.

Figure 19:
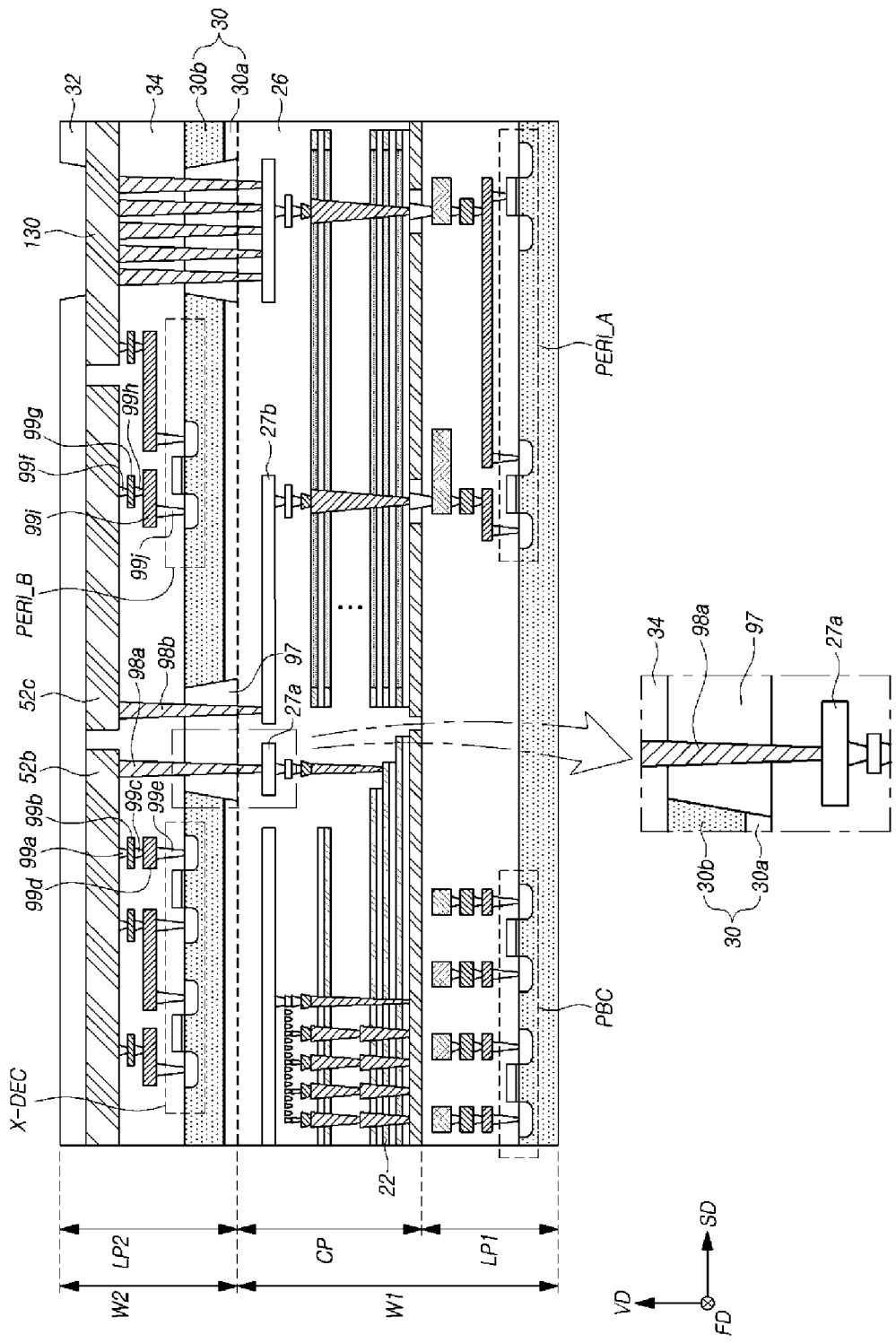
FIG. 19 is a cross-sectional view illustrating a representation of an example of a memory device in accordance with an embodiment of the disclosure.

FIG. 19 is a cross-sectional view illustrating a representation of an example of a memory device in accordance with an embodiment of the disclosure.

Referring to FIG. 19, the second substrate 30 of the second wafer W2 may include a dielectric layer 30a and a semiconductor layer 30b that is stacked on the dielectric layer 30a. The dielectric layer 30a may include silicon oxide. The semiconductor layer 30b may include silicon or germanium. The second substrate 30 may be a silicon-on-insulator (SOI) substrate or a germanium-on-insulator (GOI) substrate. The top surface of the semiconductor layer 30b may constitute the active surface of the second substrate 30, and the bottom surface of the dielectric layer 30a may constitute the back surface of the second substrate 30.

The row decoder X-DEC and the second peripheral circuit PERI_B may be disposed on the active surface of the second substrate 30. An isolation dielectric layer 97, which passes through the second substrate 30 from the back surface of the second substrate 30, may be defined. The isolation dielectric layer 97 may be formed of oxide.

The isolation dielectric layer 97 may be passed through by plugs 98a and 98b, which will be described below, and may serve to insulate the plugs 98a and 98b and the second substrate 30 from each other. The isolation dielectric layer 97 may be continuously formed in a region where the row decoder X-DEC and the second peripheral circuit PERI_B are not disposed. If the isolation dielectric layer 97 is locally formed only around each of the plugs 98a and 98b, then the coupling capacitance between the semiconductor layer 30b and each of the plugs 98a and 98b becomes excessively large, and thus, the electrical characteristics of the memory device may degrade. Instead, the isolation dielectric layer 97 may be continuously disposed in the region where the row decoder X-DEC and the second peripheral circuit PERI_B are not disposed, and the plugs 98a and 98b may pass through the isolation dielectric layer 97 in a state in which they are spaced apart from the second substrate 30 by at least a predetermined distance. According to this fact, because it is possible to secure the thickness of the isolation dielectric layer 97 between the semiconductor layer 30b and the plugs 98a and 98b, the coupling capacitance between the semiconductor layer 30b and the plugs 98a and 98b may be reduced.

Although the present embodiment illustrates elements included in the second logic structure LP2 configuring the row decoder X-DEC and the second peripheral circuit PERI_B, and elements included in the first logic structure LP1 configuring the page buffer circuit PBC and the first peripheral circuit PERI_A, the disclosure is not limited thereto. Circuits configured by elements included in the first logic structure LP1 and circuits configured by elements included in the second logic structure LP2 may be changed as aforementioned in the above embodiments.

The second wafer W2 may be bonded onto the first wafer W1 in a face-up type such that the back surface of the second substrate 30 is brought into contact with the top surface of the first wafer W1. The dielectric layer 30a constituting the back surface of the second substrate 30 and the dielectric layer 26 constituting the top surface of the first wafer W1 may be bonded to each other. Like the dielectric layer 30a, the dielectric layer 26 may be formed of oxide.

A dielectric layer 34 may be defined on the active surface of the second substrate 30 to cover the row decoder X-DEC and the second peripheral circuit PERI_B. A wiring line 27a, which is electrically coupled to the electrode layer 22, may be defined in the dielectric layer 26. The plug 98a, which is coupled to the wiring line 27a through the dielectric layer 34 and the isolation dielectric layer 97, may be defined. The plug 98a may pass through the bonding surface between the first wafer W1 and the second wafer W2, and the bottom end of the plug 98a may be directly coupled to the wiring line 27a.

A wiring line 27b, which is electrically coupled to the first peripheral circuit PERI_A, may be disposed in the dielectric layer 26 of the first wafer W1. The plug 98b, which is coupled to the wiring line 27b through the dielectric layer 34 and the isolation dielectric layer 97, may be defined. The plug 98b may pass through the bonding surface between the first wafer W1 and the second wafer W2, and the bottom end of the plug 98b may be directly coupled to the wiring line 27b.

Wiring lines 52b and 52c may be defined on the dielectric layer 34 and the plugs 98a and 98b, and may be coupled to the plugs 98a and 98b, respectively. The wiring lines 52b and 52c may be formed together with the external coupling pad 130 when forming the external coupling pad 130, and may be made of the same material as the external coupling pad 130. The wiring line 52b may be coupled to the row decoder X-DEC through contact structures 99a to 99e, and the wiring line 52c may be coupled to the second peripheral circuit PERI_B through contact structures 99f to 99j.

In the present embodiment, unlike the above-described embodiments, bonding pads are not used in coupling elements defined in the first wafer W1 and elements defined in the second wafer W2. Therefore, since it is not necessary to align bonding pads when bonding the first and second wafers W1 and W2, a coupling failure due to pad misalignment may be prevented.

Figure 20:
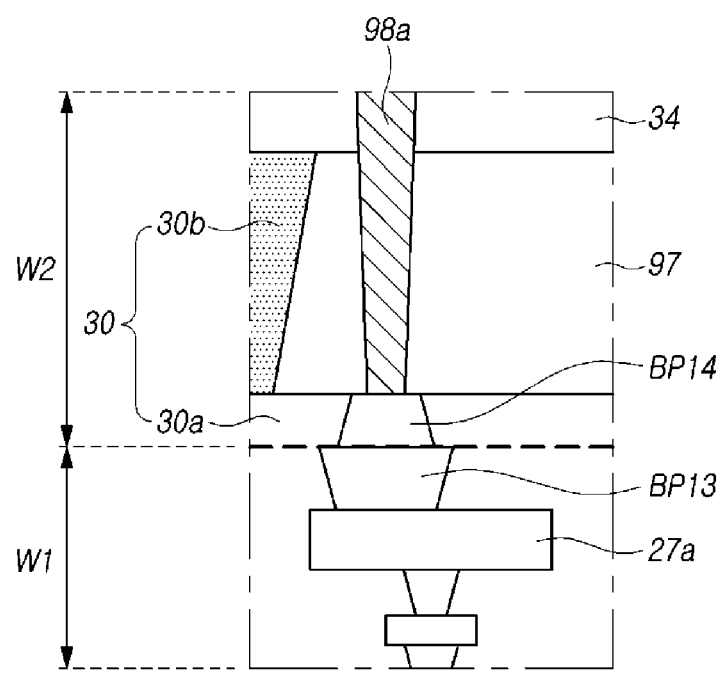
FIGS. 20 and 21 are cross-sectional views illustrating representations of examples of coupling structures between a first wafer and a second wafer.
Figure 21:
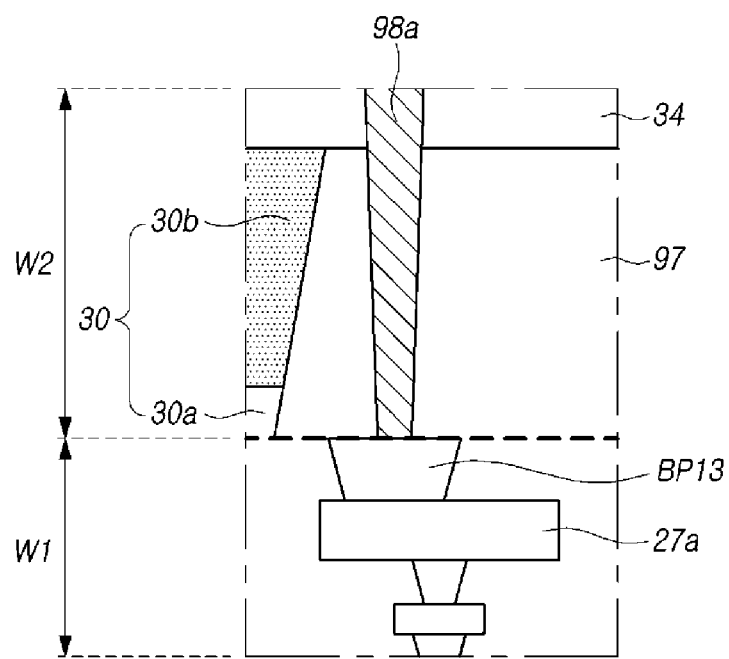

FIGS. 20 and 21 are cross-sectional views illustrating representations of examples of coupling structures between a first wafer and a second wafer.

Referring to FIG. 20, the isolation dielectric layer 97 may pass through the semiconductor layer 30b of the second substrate 30, and may not pass through the dielectric layer 30a of the second substrate 30. The plug 98a may pass through the dielectric layer 34 and the isolation dielectric layer 97, and may not pass through the dielectric layer 30a of the second substrate 30. A bonding pad BP14, which is coupled to the plug 98a by passing through the dielectric layer 30a of the second substrate 30 from the bottom surface of the dielectric layer 30a, may be defined. The bonding pad BP14 may be bonded to a bonding pad BP13, which is defined on one surface of the first wafer W1 bonded to the second wafer W2.

Referring to FIG. 21, the isolation dielectric layer 97 may pass through the semiconductor layer 30b and the dielectric layer 30a of the second substrate 30. After the second wafer W2 is bonded to one surface of the first wafer W1 on which a bonding pad BP13 is defined, the plug 98a, which is coupled to the bonding pad BP13 by passing through the dielectric layer 34 and the isolation dielectric layer 97 from the top surface of the dielectric layer 34, may be defined. The bottom end of the plug 98a may be directly coupled to the bonding pad BP13 of the first wafer W1.

Figure 22:
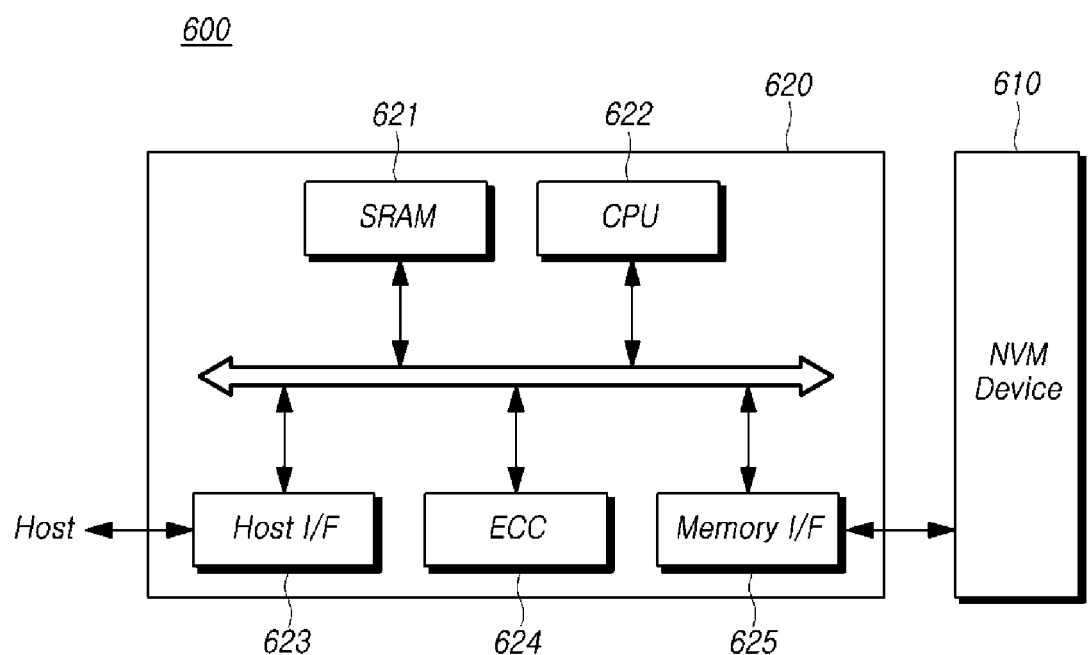
FIG. 22 is a simplified block diagram schematically illustrating a memory system including a memory device in accordance with an embodiment of the disclosure.

FIG. 22 is a block diagram schematically illustrating a representation of an example of a memory system including a memory device in accordance with an embodiment.

Referring to FIG. 22, a memory system 600 in accordance with an embodiment may include a nonvolatile memory device 610 and a memory controller 620.

The nonvolatile memory device 610 may be constituted by a memory device described above and may operate in the manner described above. The memory controller 620 may be configured to control the nonvolatile memory device (NVM Device) 610. The combination of the nonvolatile memory device 610 and the memory controller 620 may be provided as a memory card or a solid state disk (SSD). An SRAM 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device 610.

A memory interface (MEMORY I/F) 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 23:
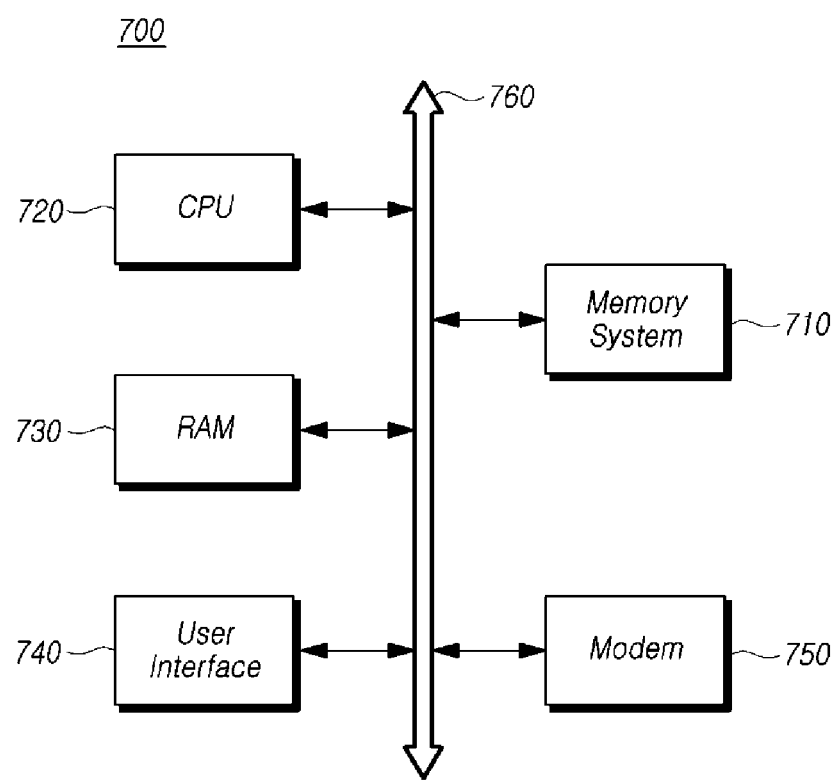
FIG. 23 is a block diagram schematically illustrating a representation of an example of a computing system including a memory device in accordance with an embodiment of the disclosure.

FIG. 23 is a block diagram schematically illustrating a representation of an example of a computing system including a memory device in accordance with an embodiment of the disclosure.

Referring to FIG. 23, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A memory device comprising:
a first wafer, and a second wafer stacked on and bonded to the first wafer,
wherein the first wafer comprises:
a cell structure including a memory cell array; and
a first logic structure disposed under the cell structure, and including a row control circuit,
wherein the second wafer comprises a second logic structure including a column control circuit,
wherein the memory cell array comprises a stack structure that is disposed on a source plate in a cell region and a slimming region, and bit lines disposed over the stack structure,
wherein the cell structure includes a source electrode that is coupled to the source plate through a contact structure passing through the stack structure, and
wherein the source electrode is disposed in the cell region of a wiring layer between the bit lines and the second wafer.

2. The memory device according to claim 1, wherein a portion of the column control circuit and a portion of the row control circuit overlap with each other in a stack direction of the first and second wafers.

3. The memory device according to claim 1, wherein the row control circuit comprises a row decoder.

4. The memory device according to claim 1, wherein the row control circuit comprises a pass transistor circuit.

5. The memory device according to claim 4, further comprising:
a block switch circuit configured to control the pass transistor circuit,
wherein the block switch circuit is disposed in the second logic structure.

6. The memory device according to claim 1, further comprising:
a peripheral circuit,
wherein the peripheral circuit is disposed in a region where the row control circuit is not disposed in the first logic structure.

7. The memory device according to claim 1, further comprising:
a first peripheral circuit and a second peripheral circuit,
wherein the first peripheral circuit is disposed in a region where the row control circuit is not disposed in the first logic structure, and
wherein the second peripheral circuit is disposed in a region where the column control circuit is not disposed in the second logic structure.

8. The memory device according to claim 7,
wherein the first peripheral circuit comprises a plurality of first horizontal transistors each having a gate dielectric layer with a thickness, and the second peripheral circuit comprises a plurality of second horizontal transistors each having a gate dielectric layer with a thickness, and
wherein a gate dielectric layer with the least thickness from among the plurality of first horizontal transistors is thicker than a gate dielectric layer with the least thickness from among the plurality of second horizontal transistors.

9. The memory device according to claim 7,
wherein the first peripheral circuit comprises first horizontal transistors, and the second peripheral circuit comprises second horizontal transistors, and
wherein the number of different thicknesses of gate dielectric layers of the first horizontal transistors is smaller than the number of different thicknesses of gate dielectric layers of the second horizontal transistors.

10. The memory device according to claim 7, wherein the first peripheral circuit comprises a first circuit that controls the row control circuit, and the second peripheral circuit comprises a second circuit that controls the column control circuit.

11. The memory device according to claim 1,
wherein the memory cell array is disposed in the cell region, and wherein the column control circuit overlaps with the memory cell array in the cell region.

12. The memory device according to claim 11, wherein the row control circuit is disposed in the slimming region and an edge portion of the cell region, which is adjacent to the slimming region.

13. The memory device according to claim 12,
wherein the memory cell array comprises a stack structure that is disposed on the source plate in the cell region and the slimming region, and vertical channels that pass through the stack structure in the cell region,
wherein the stack structure comprises:
a plurality of dielectric layers and a plurality of interlayer dielectric layers alternately stacked in a part of the slimming region; and
a plurality of electrode layers and the plurality of interlayer dielectric layers alternately stacked in the cell region and the other part of the slimming region,
wherein the vertical channels pass through the plurality of electrode layers and the plurality of interlayer dielectric layers stacked alternately in the cell region, and
wherein the electrode layers are coupled to the row control circuit through a plurality of vias that pass through the plurality of dielectric layers and the plurality of interlayer dielectric layers stacked alternately.

14. The memory device according to claim 1, further comprising:
a first bonding pad disposed on one surface of the first wafer bonded to the second wafer, and electrically coupled to a bit line of the memory cell array; and
a second bonding pad electrically coupled to the column control circuit, disposed on one surface of the second wafer bonded to the first wafer, and bonded to the first bonding pad.

* * * * *